US012776625B2

(12) United States Patent
Ollanik et al.

(10) Patent No.: US 12,776,625 B2
(45) Date of Patent: Oct. 27, 2026

(54) SEEDING AND OPTICAL PUMPING OF INTEGRATED LASERS FOR TRAPPED PARTICLE INTERACTION

(71) Applicant: Quantinuum LLC, Broomfield, CO (US)

(72) Inventors: Adam Ollanik, Boulder, CO (US); Matthew Bohn, Broomfield, CO (US); Christopher Langer, Highlands Ranch, CO (US)

(73) Assignee: Quantinuum LLC, Broomfield, CO (US)

( * ) Notice: Subject to any disclaimer, the term of this patent is extended or adjusted under 35 U.S.C. 154(b) by 805 days.

(21) Appl. No.: 18/299,785

(22) Filed: Apr. 13, 2023

(65) Prior Publication Data

US 2023/0344199 A1 Oct. 26, 2023

Related U.S. Application Data

(60) Provisional application No. 63/363,506, filed on Apr. 25, 2022.

(51) Int. Cl.
*H01S 5/20* (2006.01)
*B82Y 20/00* (2011.01)
(Continued)

(52) U.S. Cl.
CPC ............ *H01S 5/2031* (2013.01); *B82Y 20/00* (2013.01); *G21K 1/20* (2026.01); *G21K 1/30* (2026.01); *H01S 5/041* (2013.01)

(58) Field of Classification Search
CPC ........ G06N 10/40; H01S 5/2031; H01S 5/041
See application file for complete search history.

(56) References Cited

U.S. PATENT DOCUMENTS 11,037,776 B1 6/2021 Makotyn et al.
11,150,609 B1 10/2021 Parazzoli et al.
(Continued)

FOREIGN PATENT DOCUMENTS

CN 114514192 A 5/2022
CN 115516469 A 12/2022
(Continued)

OTHER PUBLICATIONS

Mehta, et al., "Integrated Optical Addressing of an Ion Qubit", submitted Oct. 19, 2015 to Cornell University Library Archive, https://arXiv.org/abs/1510.05618v1 (Year: 2015).*
(Continued)

*Primary Examiner* — David E Smith
(74) *Attorney, Agent, or Firm* — Alston & Bird LLP

(57) ABSTRACT

A confinement assembly configured for confining quantum objects is provided. The confinement assembly includes a first substrate having potential generating elements formed thereon; and may include a second substrate that is secured with respect to the first substrate. The confinement assembly further includes at least a portion of a laser (e.g., gain media and at least part of a resonant structure) formed on the first and/or second substrate. The potential generating elements are operable for generating confinement regions configured for confining the quantum objects. The confinement assembly at least partially defines an optical path for causing an optical beam to interact with the at least a portion of the laser. The optical beam is (a) a seeding laser beam configured to control at least one property of light emitted by the laser or (b) an optical pumping beam configured to power the lasing activity of the laser.

21 Claims, 11 Drawing Sheets

(51) Int. Cl.

| | |
|---|---|
| ***G21K 1/20*** | (2026.01) |
| ***G21K 1/30*** | (2026.01) |
| ***H01S 5/04*** | (2006.01) |

(56) References Cited

U.S. PATENT DOCUMENTS

| | | | | |
|---|---|---|---|---|
| 11,586,968 | B2 * | 2/2023 | King | G06N 10/20 |
| 2005/0152429 | A1 * | 7/2005 | Scherer | H01S 5/041<br>372/20 |
| 2006/0153257 | A1 | 7/2006 | Franjic et al. | |
| 2020/0067281 | A1 | 2/2020 | Curwen et al. | |
| 2020/0227632 | A1 | 7/2020 | Kim et al. | |
| 2020/0366067 | A1 | 11/2020 | David et al. | |
| 2021/0026162 | A1 | 1/2021 | Apisdorf et al. | |
| 2021/0272006 | A1 | 9/2021 | King et al. | |
| 2022/0021459 | A1 | 1/2022 | Kurczveil et al. | |
| 2022/0102134 | A1 * | 3/2022 | Roessler | H01J 49/4225 |
| 2022/0327414 | A1 | 10/2022 | Bohn et al. | |

FOREIGN PATENT DOCUMENTS

| | | | |
|---|---|---|---|
| JP | 2022-542860 | A | 10/2022 |
| JP | 2023-520127 | A | 5/2023 |

OTHER PUBLICATIONS

Outgoing—ISA/210—International Search Report Mailed on Dec. 2, 2024 for WO Application No. PCT/US23/019038, 3 page(s).
Outgoing Written Opinion of the ISA Mailed on Dec. 2, 2024 for WO Application No. PCT/US23/019038, 7 page (s).
Paschotta, R. "Photonic Crystal Surface-emitting Lasers", RP Photonics Encyclopedia, retrieved from the Internet at https://www.rp-photonics.com/photonic_crystal_surface_emitting_lasers.html#:~:text=Acronym%3A%20PCSEL,laser%20devices%20and%20laser%20physics on Feb. 23, 2024, 8 pages.
Ra, Yong-Ho, et al., "An electrically pumped surface-emitting semiconductor green laser", Science Advances, Research Article, Jan. 3, 2020, 8 pages, vol. 6, No. eaav8523, American Associate for the Advancement of Science, US.
U.S. Nonprovisional Application for "Active Nano-Photonics for Trapped Particle Interaction", unpublished (filed Mar. 27, 2023), Adam Ollanik (Inventor), Quantinuum LLC (Assignee), U.S. Appl. No. 18/190,496.
U.S. Provisional Patent Application for "Qubit Reading Procedure including Coherent Shelving", unpublished (filed Feb. 25, 2021), Anthony Ransford (Inventor), Quantinuum LLC (Assignee), U.S. Appl. No. 63/200,263.
US Provisional Patent Application for "Apparatuses, Systems, and Methods for Elliptical Atomic Object Traps", unpublished (filed Dec. 17, 2020), David Hayes (Inventor), Quantinuum LLC (Assignee), U.S. Appl. No. 63/199,279.
English Translation of JP Notice of Allowance, including Search Report, dated Dec. 2, 2025 for JP Application No. 2024563116, 16 page(s).
English Translation of JP Office Action, including Search Report dated Dec. 9, 2025 for JP Application No. 2024563115, 18 page(s).
JP Notice of Allowance, including Search Report, Mailed on Dec. 2, 2025 for JP Application No. 2024563116, 14 page(s).
JP Office Action, including Search Report Mailed on Dec. 9, 2025 for JP Application No. 2024563115, 13 page (s).
Mehta, Karan, K., et al., "Integrated optical addressing of an ion qubit", submitted Oct. 19, 2015 to Cornell University Olin Library Archive retrieved from the Internet at <https://arXiv.org/abs/1510.05618v1> on Dec. 16, 2025, 7 pages.
Rowland, Jed, et al., "Using an injection-locked VCSEL to produce Fourier Transform-limited optical pulses", Optics Letters (Draft), compiled Dec. 17, 2020, retrieved from the Internet at https://www.researchgate.net/publication/347685754_Using_an_injection-locked_VCSEL_to_produce_Fourier-transform-limited_optical_pulses on Dec. 16, 2025, 5 pages.
Niffenegger, R. J., "Integrated multi-wavelength control of an ion qubit", Nature, Oct. 21, 2020 (online), 12 pages, vol. 586, Nature Portfolio, Germany.
Outgoing—ISA/210—International Search Report Mailed on Apr. 8, 2024 for WO Application No. PCT/US23/018958, 4 page(s).
Outgoing Written Opinion of the ISA Mailed on Apr. 8, 2024 for WO Application No. PCT/US23/018958, 8 page(s).
English translation of JP Decision to Grant dated Jun. 23, 2026 for JP Application No. 2024563115, 2 page(s).
JP Decision to Grant Mailed on Jun. 23, 2026 for JP Application No. 2024563115, 3 page(s).

* cited by examiner

SEEDING AND OPTICAL PUMPING OF INTEGRATED LASERS FOR TRAPPED PARTICLE INTERACTION

CROSS-REFERENCE TO RELATED APPLICATIONS

This application claims priority to U.S. Application No. 63/363,506, filed Apr. 25, 2022, the content of which is incorporated herein by reference in its entirety.

TECHNICAL FIELD

Various embodiments relate to apparatuses, systems, and methods relating to the use of active nano-photonics to interact with trapped particles. For example, various embodiments relate to apparatuses, systems, and methods relating to the use of active nano-photonics to cause optical beams to be incident on trapped particles and/or to detect optical signals emitted by trapped particles. An example embodiment relates to the use of active nano-photonics for interacting with qubits of a quantum computer.

BACKGROUND

When using an ion trap to perform quantum computing, gates and other functions of the quantum computer are performed by applying laser beams to ions contained within the ion trap. Delivering these laser beams to a large scale quantum computer is a significant challenge due to the low ion height above the trap, the Rayleigh range of the laser beams, and the amount of laser power that needs to be delivered to an ion within the trap to perform the functions of the quantum computer. Through applied effort, ingenuity, and innovation many deficiencies of prior laser beam application techniques have been solved by developing solutions that are structured in accordance with the embodiments of the present invention, many examples of which are described in detail herein.

BRIEF SUMMARY OF EXAMPLE EMBODIMENTS

Example embodiments provide methods, systems, apparatuses, computer program products and/or the like for interacting with particles and/or causing particle interactions using signal manipulation elements that comprise active nano-photonics. In various embodiments, the interactions with the particles are through optical beams and/or signals applied to and/or incident on the particles. In various embodiments, the particle interactions (e.g., interactions between two or more particles) are caused and/or mediated by optical beams and/or signals applied to and/or incident on the particles that are interacting with one another.

In various embodiments, the particles are trapped and/or confined quantum objects (e.g., atoms, ions, groups of atoms and/or ions, molecules, quantum particles, and/or the like), qubits, and/or the like. For example, the particles may be confined and/or trapped by a confinement assembly comprising and/or associated with a signal management system comprising a plurality of signal manipulation elements. In various embodiments, the signal manipulation elements comprise active nano-photonics such as metasurfaces, metamaterials, photonic crystals, diffractive optical elements, microfabricated surfaces configured to perform signal control functions (e.g., reflection, refraction, diffraction, and/or the like), and/or the like that have dynamically controllable optical effects. In various embodiments, an incident signal and/or beam (e.g., an incoming manipulation signal and/or beam and/or a stimulated signal and/or beam) is incident on an signal manipulation element and an induced signal and/or beam is emitted that is applied to a particle location or a collection location corresponding to a respective particle location.

In various embodiments, one or more properties of the induced signal and/or beam are determined based on a state of the dynamically controllable optical effects of the signal manipulation element. Some non-limiting examples of properties of the induced signal and/or beam that may be determined based on the state of the dynamically controllable optical effects of the signal manipulation element include beam position/angle (direction of propagation of the induced signal/beam), focal length, polarization, phase, frequency, beam pattern, and power (e.g., amplitude), and/or the like.

According to an aspect of the present disclosure, a system is provided (e.g., a signal management system, a quantum computer, a trapped particle system, and/or the like). In an example embodiment, the system comprises a confinement assembly and one or more signal manipulation elements. The particle confinement assembly defines a plurality of particle positions. Each signal manipulation element of the one or more signal manipulation elements (a) is associated with at least one respective position of the plurality of particle positions and (b) comprises an active nano-photonic component having at least one dynamically controllable optical effect. A respective signal manipulation element of the one or more signal manipulation elements is configured to, responsive to an incident signal being incident thereon and based on a state of the dynamically controllable optical effect, cause either (a) an induced signal to be incident on at least a portion of the at least one respective position or (b) an induced signal to be incident on a respective collection location corresponding to the at least one respective position.

In an example embodiment, one or more properties of the induced signal are controlled by the state of the dynamically controllable optical effect.

In an example embodiment, the one or more properties of the induced signal comprise one or more of beam position/angle, focal length, polarization, phase, frequency, beam pattern, and power.

In an example embodiment, the state of the dynamically controllable optical effect is controlled via at least one of application of an electrical signal or electric field to the respective signal manipulation element, polarization of the incident signal, a mechanical adjustment or movement of the respective signal manipulation element, temperature of the respective signal manipulation element, electro-optical effects of the respective signal manipulation element, acousto-optical effects of the respective signal manipulation element, or photo-elastic effects of the respective signal manipulation element.

In an example embodiment, the confinement assembly is formed at least in part on a first substrate and at least one of the one or more signal manipulation elements is formed on the first substrate.

In an example embodiment, the confinement assembly is formed at least in part on a first substrate and at least one of the one or more signal manipulation elements is formed on a second substrate that is mounted in a secured or controllable manner with respect to the first substrate.

In an example embodiment, a manipulation source is formed at least partially on and/or at least partially in the first substrate or the second substrate.

In an example embodiment, the manipulation source comprises a resonant structure formed as an array of nano-photonic structures.

In an example embodiment, the array of nano-photonic structures is configured to have a metasurface or diffractive effect.

In an example embodiment, the array of nano-photonic structures forms a photonic crystal structure and at least a portion of the photonic crystal structure is configured to have a metasurface or diffractive effect.

In an example embodiment, the array of nano-photonic structures is configured to be seeded with a seed beam and the seed beam controls at least one of a frequency of light emitted by the laser or a line width of light emitted by the laser.

In an example embodiment, the manipulation source is a vertical external cavity surface emitting laser (VECSEL) comprising an external cavity defined at least in part by at least one of the one or more signal manipulation elements.

In an example embodiment, the external cavity is defined by a first signal manipulation element formed on the first substrate and a second signal manipulation element formed on the second substrate.

In an example embodiment, the manipulation source is a vertical cavity surface emitting lase (VCSEL) formed at least partially within the first substrate or the second substrate and a signal manipulation element is disposed along an emission axis of the VCSEL such that the signal manipulation element is configured to control at least one property of a signal emitted by the VCSEL.

In an example embodiment, injection locking or seeding of a cavity of the manipulation source is used to control a frequency or linewidth of a signal emitted by the manipulation source.

In an example embodiment, at least one of the signal manipulation elements is configured to modulate at least one of an amplitude, phase, frequency, or polarization of the induced signal.

In an example embodiment, at least one of the signal manipulation elements has a dynamically controllable refractive index.

In an example embodiment, the dynamically controllable refractive index is used to steer or control the propagation direction of the induced signal.

In an example embodiment, at least one signal manipulation element comprises a photoactive material and is configured to provide an electrical signal responsive light being incident thereon.

In an example embodiment, the induced signal has a different frequency than the incident signal.

In an example embodiment, the incident signal is an infrared signal and the induced signal is a visible or UV signal.

In an example embodiment, the respective signal manipulation element is configured to convert a frequency of incident signal into a frequency of the induced signal using at least one of harmonic generation or time-variant conversion effects.

In an example embodiment, the incident signal is a pulsed signal.

In an example embodiment, the induced signal is used to perform a background free, gated reading function.

In an example embodiment, a vertical external cavity surface emitting laser (VECSEL) is provided. In an example embodiment, the VECSEL is formed at least in part on or in a first substrate and at least in part on or in a second substrate. The VECSEL comprises a first signal manipulation element disposed on the first substrate; and a second signal manipulation element disposed on the second substrate. The first signal manipulation element and the second signal manipulation element define an external cavity of the VECSEL. At least one of the first signal manipulation element and the second signal manipulation element comprises a respective active nanophotonic component having a dynamically controllable optical effect.

In an example embodiment, at least one of the first substrate or the second substrate defines a surface normal and the external cavity of the VECSEL is angled with respect to the surface normal.

In an example embodiment, a confinement assembly configured to confine one or more particles is formed on the first substrate.

In an example embodiment, the confinement assembly defines a plurality of particle positions and a first particle position of the plurality of particle positions is disposed between the first signal manipulation element and the second manipulation element, such that the particle position is disposed within the external cavity.

According to another aspect, a trapped particle system is provided. In an example embodiment, the trapped particle system comprises a confinement assembly configured to confine one or more particles and defining a plurality of particle positions, the confinement assembly formed on a first substrate, a second substrate mounted in a secured or controllable manner with respect to the first substrate, and a first vertical external cavity surface emitting laser (VECSEL) formed at least in part on or in the first substrate and at least in part on or in the second substrate. The first VECSEL comprises a first signal manipulation element disposed on the first substrate; and a second signal manipulation element disposed on the second substrate. The first signal manipulation element and the second signal manipulation element define an external cavity of the first VECSEL. At least one of the first signal manipulation element and the second signal manipulation element comprises a respective active nanophotonic component having a dynamically controllable optical effect. A first particle position of the plurality of particle positions is disposed between the first signal manipulation element and the second signal manipulation element such that the first particle position is disposed within the external cavity of the first VECSEL.

In an example embodiment, at least one of the first substrate or the second substrate defines a surface normal and the external cavity of the first VECSEL is angled with respect to the surface normal.

In an example embodiment, the trapped particle system further comprises a second VECSEL formed at least in part on or in the first substrate and at least in part on or in the second substrate. The second VECSEL comprises a third signal manipulation element disposed on the first substrate; and a fourth signal manipulation element disposed on the second substrate. The third signal manipulation element and the fourth signal manipulation element define an external cavity of the second VECSEL. At least one of the third signal manipulation element and the fourth signal manipulation element comprises a respective active nanophotonic component having a dynamically controllable optical effect. The first particle position is disposed between the third signal manipulation element and the fourth signal manipulation element such that the first particle position is disposed within the external cavity of the second VECSEL.

According to another aspect an integrated laser is provided. In an example embodiment, the laser comprises a photonic crystal structure defining a photonic crystal cavity. At least a portion of the photonic crystal structure is configured to have a metasurface or diffractive effect.

In an example embodiment, the portion of the photonic crystal structure is an emission surface of the photonic crystal structure.

In an example embodiment, the metasurface or diffractive effect is configured to control at least one of a direction of propagation, polarization, or phase of light emitted by the laser.

According to another aspect an integrated laser is provided. In an example embodiment, the laser comprises a photonic crystal structure defining a photonic crystal cavity. The photonic crystal cavity is configured to be seeded with a seed beam and the seed beam controls at least one of a frequency of light emitted by the laser or a line width of light emitted by the laser.

In an example embodiment, the seed beam is a laser beam generated by an external laser and has an external laser power, the laser is configured to emit an emission beam having an emitted laser power, the emitted laser power is larger than the external laser power.

According to another aspect, a confinement assembly configured for confining one or more quantum objects is provided. The confinement assembly includes a first substrate having a plurality of potential generating elements formed thereon; and at least a portion of a laser formed on the first substrate, wherein the at least a portion of the laser comprises gain media and at least a portion of a resonant structure. The potential generating elements are operable for generating one or more confinement regions configured for confining the one or more quantum objects. The confinement assembly at least partially defines an optical path for causing at least one optical beam to interact with the at least a portion of the laser. The at least one optical beam is one of (a) a seeding laser beam configured to control at least one property of light emitted by the laser or (b) an optical pumping beam configured to power the lasing activity of the laser.

In an example embodiment, the optical path for providing the at least one optical beam comprises a free space optical path.

In an example embodiment, the free space optical path is defined at least in part by and/or includes one or more free space optics elements.

In an example embodiment, the optical path is configured to cause the at least one optical beam to interact with the at least a portion of the laser by causing the at least one optical beam to be incident on at least one of the gain media or the resonant structure.

In an example embodiment, the optical path comprises a waveguide disposed in the first substrate.

In an example embodiment, the waveguide is configured to cause the at least one optical beam to interact with the at least a portion of the laser by one of (i) providing the at least one optical beam to be incident on at least one of the gain media or the resonant structure via an out-of-plane coupler, (ii) providing the at least one optical beam to be incident on at least one of the gain media or the resonant structure via an edge coupling, or (iii) causing the at least one optical beam to interact with the gain media via evanescent coupling.

In an example embodiment, the waveguide is a slab waveguide and the slab waveguide is configured to cause the at least one optical beam to interact with the at least the portion of the laser via at least one of an out-of-plane coupler, evanescent coupling, or direct coupling.

In an example embodiment, the waveguide is a slab waveguide and the slab waveguide is coupled to the at least a portion of the laser via a metasurface coupler.

In an example embodiment, the slab waveguide is configured to have two or more optical beams propagating therethrough, where the two or more optical beams differ from one another in at least one of wavelength or polarization, and the metasurface coupler is configured to cause the at least a portion of the laser to interact with only one of the two or more optical beams.

In an example embodiment, the at least one optical beam is generated by one of (a) an external laser source external to the confinement assembly or (b) an integrated laser that is part of the confinement assembly.

In an example embodiment, the confinement assembly further includes a second substrate that is mounted to the first substrate and/or secured with respect to the first substrate, wherein the second substrate at least partially defines the optical path for causing the at least one optical beam to interact with the at least a portion of the laser.

In an example embodiment, the optical path comprises a waveguide formed in the second substrate.

In an example embodiment, the waveguide is configured to cause the at least one optical beam to interact with the at least a portion of the laser by one of (a) providing the at least one optical beam to be incident on at least one of the gain media or the resonant structure via an out-of-plane coupler, (b) providing the at least one optical beam to be incident on at least one of the gain media or the resonant structure via an edge coupling, or (c) causing the at least one optical beam to interact with the gain media via evanescent coupling.

In an example embodiment, the waveguide is a slab waveguide configured to cause the at least one optical beam to interact with the at least the portion of the laser via at least one of an out-of-plane coupler, evanescent coupling, or direct coupling.

In an example embodiment, the waveguide is a slab waveguide configured to cause the at least one optical beam to interact with the at least the portion of the laser via a metasurface coupler.

In an example embodiment, the slab waveguide is configured to have two or more optical beams propagating therethrough, where the optical beams differ from one another in at least one of wavelength or polarization, and the metasurface coupler is configured to cause the at least a portion of the laser to interact with only one of the two or more optical beams.

According to another aspect, a confinement assembly configured for confining one or more quantum objects is provided. The confinement assembly includes a first substrate having a plurality of potential generating elements formed thereon; a second substrate that is mounted to the first substrate and/or secured with respect to the first substrate; and at least a portion of a laser formed on the second substrate. The at least a portion of the laser comprises gain media and at least a portion of a resonant structure. The potential generating elements are operable for generating one or more confinement regions configured for confining the one or more quantum objects. The confinement assembly at least partially defines an optical path for causing at least one optical beam to interact with the at least a portion of the laser. The at least one optical beam is one of (a) a seeding laser beam configured to control at least one property of light emitted by the laser or (b) an optical pumping beam configured to power the lasing activity of the laser.

In an example embodiment, the optical path for providing the at least one optical beam comprises a free space optical path.

In an example embodiment, the free space optical path is defined at least in part by one or more free space optics elements.

In an example embodiment, the optical path is configured to cause the at least one optical beam to interact with the at least a portion of the laser by causing the at least one optical beam to be incident on at least one of the gain media or the resonant structure.

In an example embodiment, the optical path comprises a waveguide disposed in either the first substrate or the second substrate.

In an example embodiment, the waveguide is configured to cause the at least one optical beam to interact with the at least a portion of the laser by one of (a) providing the at least one optical beam to be incident on at least one of the gain media or the resonant structure via an out-of-plane coupler, (b) providing the at least one optical beam to be incident on at least one of the gain media or the resonant structure via an edge coupling, or (c) causing the at least one optical beam to interact with the gain media via evanescent coupling.

In an example embodiment, the waveguide is a slab waveguide.

In an example embodiment, the slab waveguide is configured to cause the at least one optical beam to interact with the at least the portion of the laser via at least one of an out-of-plane coupler, evanescent coupling, or direct coupling.

In an example embodiment, the slab waveguide is coupled to the at least a portion of the laser via a metasurface coupler.

In an example embodiment, the slab waveguide is configured to have two or more optical beams propagating therethrough, where the two or more optical beams differ from one another in at least one of wavelength or polarization, and the metasurface coupler is configured to cause the at least a portion of the laser to interact with only one of the two or more optical beams.

In an example embodiment, the at least one optical beam is generated by one of (a) an external laser source external to the confinement assembly or (b) an integrated laser that is part of the confinement assembly.

According to another aspect, a confinement assembly configured for confining one or more quantum objects is provided. The confinement assembly includes a first substrate having a plurality of potential generating elements formed thereon; and respective portions of a plurality of lasers formed as part of the confinement assembly. The potential generating elements are operable for generating one or more confinement regions configured for confining the one or more quantum objects. At least one laser of the plurality of lasers is configured to provide a respective seed laser beam to at least one other laser of the plurality of lasers.

In an example embodiment, the at least one other laser of the plurality of lasers is configured to provide a respective seed laser beam to another laser of the plurality of lasers.

In an example embodiment, an optical path configured for providing the respective seed laser beam from the at least one laser to the at least one other laser comprises a splitter and the at least one other laser of the plurality of lasers comprises two or more lasers of the plurality of lasers.

In an example embodiment, the at least one laser is configured to be seeded by an external laser that is external to the confinement assembly.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

Figure 14:
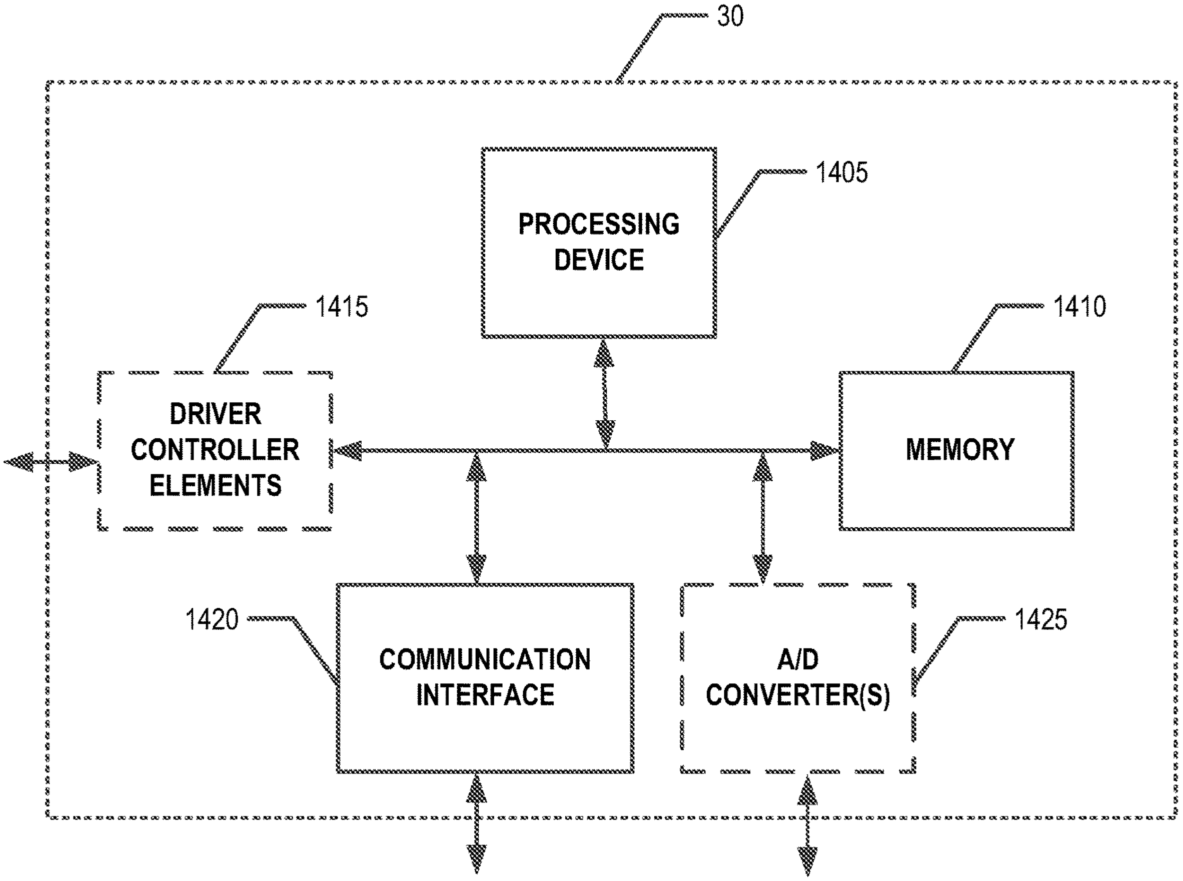

FIG. 14 provides a schematic diagram of an example controller of a quantum computer configured to perform one or more deterministic reshaping and/or reordering functions, according to various embodiments.

Figure 15:
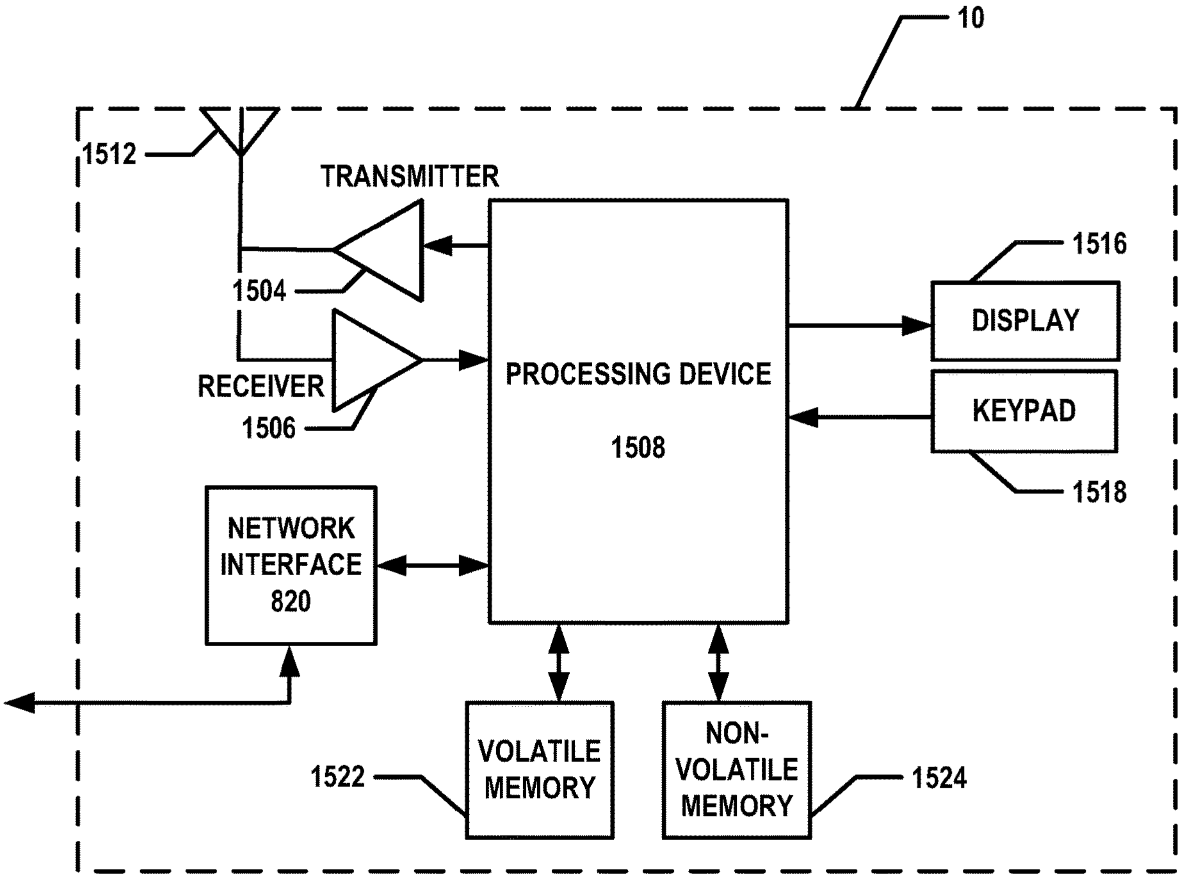

FIG. 15 provides a schematic diagram of an example computing entity of a quantum computer system that may be used in accordance with an example embodiment.

DETAILED DESCRIPTION OF SOME EXAMPLE EMBODIMENTS

The present invention now will be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. The term "or" (also denoted "/") is used herein in both the alternative and conjunctive sense, unless otherwise indicated. The terms "illustrative" and "exemplary" are used to be examples with no indication of quality level. The terms "generally," "substantially," and "approximately" refer to within engineering and/or manufacturing tolerances and/or within user measurement capabilities, unless otherwise indicated. Like numbers refer to like elements throughout.

Various embodiments provide methods, systems, apparatuses, computer program products and/or the like for interacting with particles and/or causing particle interactions using signal manipulation elements that comprise active nano-photonics. In various embodiments, active nano-photonics are nano-photonic elements having at least one dynamically controllable optical effect. Passive nano-photonics are nano-photonics elements that do not have a dynamically controllable optical effect. In various embodiments, the interactions with the particles are through optical beams and/or signals applied to and/or incident on the particles. In various embodiments, the particle interactions (e.g., interactions between two or more particles) are caused and/or mediated by optical beams and/or signals applied to and/or incident on the particles that are interacting with one another. In various embodiments, the particles are trapped and/or confined quantum objects (e.g., atoms, ions, groups of atoms and/or ions, molecules, quantum particles, and/or the like), qubits (e.g., of a quantum processor and/or quantum computer), and/or the like. For example, in an example embodiment, the particles are trapped ions that are used as qubits of a quantum charge-coupled device (QCCD)-based quantum computer. In various embodiments, the signal manipulation elements comprise one or more of metasurfaces and/or metamaterial arrays, diffractive optical elements, photonic crystals, and/or microfabricated surfaces configured to perform signal control functions (e.g., reflection, refraction, diffraction, and/or the like).

In various embodiments, the particles are trapped and/or confined by a confinement assembly comprising and/or associated with a signal management system. In various embodiments, the signal management system defines a plurality of optical paths configured to enable application of manipulation signals to particle positions defined by the confinement assembly and/or to provide indications of signals emitted by particles to a respective collection location.

In various embodiments, the signal management system comprises a plurality of signal manipulation elements. In various embodiments, the signal manipulation elements comprise active nano-photonics such as metasurfaces, metamaterials, photonic crystals, diffractive optical elements, microfabricated surfaces configured to perform signal control functions (e.g., reflection, refraction, diffraction, and/or the like), and/or the like that have dynamically controllable optical effects. In various embodiments, the dynamically controllable optical effects are controlled and/or influenced by electrical signals, electric fields, incident signal and/or beam polarization, mechanical adjustments and/or movements (e.g., controlled via electrically controlled motors, actuators, and/or the like), temperature of the nano-photonic element, electro-optical effects, acousto-optical effects, photo-elastic effects, and/or the like.

In various embodiments, an incident signal and/or beam (e.g., an incoming manipulation signal and/or a stimulated signal) is incident on an signal manipulation element and an induced signal and/or beam is emitted (e.g., by and/or from the signal manipulation element) that is applied to a particle location or a collection location corresponding to a respective particle location. In various embodiments, one or more properties of the induced signal and/or beam are determined based on a state of the dynamically controllable optical effects of the signal manipulation element. Some non-limiting examples of properties of the induced signal and/or beam that may be determined based on the state of the dynamically controllable optical effects of the signal manipulation element include beam position/angle (direction of propagation of the induced signal/beam), focal length, polarization, phase, frequency, beam pattern, and power (e.g., amplitude), chromatic filtering, and/or the like.

In various embodiments, the confinement assembly is an ion trap (e.g., a surface or Paul trap), an optical trapping lattice, a substrate having quantum dots formed and/or disposed thereon, and/or the like. In various embodiments, the confinement assembly is configured to confine and/or trap one or more particles and control the location within the confinement assembly of the one or more particles.

In various embodiments, the confinement assembly defines a plurality of particle positions. In various embodiments, one or more of the particle positions corresponds to a collection location. In various embodiments, a respective collection location is configured such that an indication of and/or induced signal/beam corresponding to light emitted by a particle at a corresponding respective particle location is detectable at and/or incident on the collection location.

In various embodiments, the induced signals and/or beams may be used to interact with confined particles and/or to cause interaction between confined particles so as to cause a controlled evolution of quantum states of one or more particles confined by the confinement assembly. For example, the induced signals may be used to ionize one or more particles, initialize the particle(s) into a predetermined quantum state, initialize the particle(s) into a defined set of quantum states (e.g., a defined qubit space and/or the like), perform quantum gates (e.g., single qubit gates, two qubit gates, and/or the like) on the particle(s), perform reading operations to determine a quantum state of the particle(s), and/or the like.

In various embodiments, the one or more signal manipulation elements are disposed and/or mounted with respect to the confinement assembly such that the signal manipulation elements form at least a portion of respective optical paths between respective particle positions and respective manipulation sources and/or photodetectors.

In various embodiments, at least one of the signal manipulation elements is disposed on a surface of a first substrate on which the confinement assembly is formed and/or disposed and/or at least partially within the first substrate on which the confinement assembly is formed and/or disposed. For example, the confinement assembly is formed on a first substrate, in various embodiments, with the at least one signal manipulation element formed and/or disposed on a surface of the first substrate. As should be understood, the first substrate may comprise multiple layers of circuitry configured to control various elements/components of the operation of the functioning of the confinement assembly.

In an example embodiment, at least one of the signal manipulation elements is part of the confinement assembly and set back and/or recessed with respect to the surface of the confinement assembly. For example, the at least one signal manipulation element may be located at a fabricated layer that is within the first substrate and/or not directly on the surface defined by the plane of the confinement assembly. For example, there may be a hole or opening in the surface of the confinement assembly with the at least one signal manipulation element recessed therein. In an example embodiment, a transparent layer encloses the at least one signal manipulation element within the hole or opening. Various embodiments provide a confinement assembly having one or more signal manipulation elements formed and/or disposed on the surface of the confinement assembly and/or as part of the first substrate comprising the confinement assembly.

An example embodiment provides a second substrate having one or more signal manipulation elements formed and/or disposed thereon and/or therein that is mounted in a secured and/or controlled relationship with respect to the confinement assembly such that manipulation signals (e.g., in the form of induced signals and/or beams) can be provided to the particle positions via respective signal manipulation elements of the second substrate.

In various embodiments, each signal manipulation element is formed and/or configured for use in performing one or more functions (photoionization, state preparation, qubit detection and/or reading, cooling, shelving, repumping, single qubit gates, or two qubit gates) of a particle system. In an example embodiment, the particle system is a QCCD-based quantum computer. Various other embodiments relate to various other types of particle systems in which particles are trapped and/or confined and the trapped and/or confined particles are interacted with and/or interactions between the trapped and/or confined particles are caused and/or mediated.

In various embodiments, each signal manipulation element is configured to provide a resonant response for incident signals and/or beams (e.g., incoming manipulation signals and/or stimulated signals) of a respective particular wavelength range similar to the signal manipulation elements described by U.S. application Ser. No. 17/653,979, filed Mar. 8, 2022 (the content of which is hereby incorporated by reference in its entirety). For example, for an incident signal (and/or portion thereof) characterized by a wavelength within the respective particular wavelength range, the signal manipulation element will be induced to emit a controlled induced signal and/or beam (e.g., controlled in terms of propagation direction, focus, beam profile, polarization, and/or the like) as a result of the incident signal being incident on the signal manipulation element.

However, if the incident signal and/or beam (and/or portions of the incident signal) that are characterized by one or more wavelengths outside of the respective particular wavelength range, the resulting signal would have a uniform phase delay applied thereto but would not experience the focusing, polarization control, beam profile control, and/or the like of the controlled induced signal. In other words, the signal manipulation elements may be used as chromatic filters, in various embodiments. For example, one or more signals of various wavelengths and/or a signal comprising various wavelengths may be made incident on a signal manipulation element. The chromatic filtering performed by the signal manipulation element (e.g., a metamaterial array configured to have a resonant response for a respective particular wavelength) causes the controlled induced signal to only include a respective particular wavelength and/or wavelengths of the respective particular wavelength range the signal manipulation element is configured for use with. For example, an incoming manipulation signal incident on a signal manipulation element will only be focused onto the corresponding particle position when the incoming manipulation signal is characterized by a wavelength within the respective particular wavelength range.

In various embodiments, the signal manipulation elements are configured such that properties of an induced signal and/or beam are determined based at least in part on respective states of one or more dynamically controllable optical effects of the signal manipulation element that emitted the induced signal and/or beam. Thus, in various embodiments, the respective particular wavelength range is dynamic and may be changed. For example, a state of the dynamically controllable optical effects of the signal manipulation element may be changed (e.g., through application of at least one of an electrical signal, electric field, magnetic field, incident signal and/or beam comprising a particular polarization, incident signal and/or beam comprising a particular frequency or frequency range, incident signal and/or beam having a particular power or being in a particular range of power, mechanical adjustments and/or movements (e.g., controlled via electrically controlled motors, actuators, and/or the like), temperature of the nanophotonic element, electro-optical effects, acousto-optical effects, photo-elastic effects, and/or the like.

In various embodiments, an signal manipulation element is configured to have more than one manipulation signal incident thereon and be induced to emit respective induced signals and/or beams responsive thereto. For example, an signal manipulation element may be configured to, responsive to a first manipulation signal of a first wavelength and first polarization being incident thereon while in a first state, be induced to emit a first induced signal having a wavelength corresponding to the first wavelength, a polarization corresponding to the first polarization, and being directed toward a first portion of a corresponding particle position. The same signal manipulation element is configured to, responsive to a second manipulation signal of a second wavelength and a second polarization being incident thereon while in a second state, be induced to emit a second induced signal having a wavelength corresponding to the second wavelength, a polarization corresponding to the second polarization, and being directed to a second portion of the corresponding particle position and/or to a different particle position, in an example embodiment.

In various embodiments, the first wavelength and second wavelength are substantially the same, the first state and the second state are the same, and the first polarization and second polarization are different. In an example embodiment, the first wavelength and the second wavelength are different, the first state and the second state are the same, and the first polarization and the second polarization are substantially the same. In an example embodiment, the first wavelength and the second wavelength are different, the first state and the second state are the same, and the first polarization and the second polarization are different. In an example embodiment, the first wavelength and the second wavelength are substantially the same, the first state and the second state are different, and the first polarization and the second polarization are substantially the same.

The first portion of particle position and the second portion of the particle position may or may not overlap, as appropriate for the application. In various embodiments, the first manipulation signal and the second manipulation signal may be provided at least partially simultaneously. For example, the first manipulation signal and the second manipulation signal may be incident on the signal manipulation element at the same time for at least a part of the time that the first manipulation signal and/or the second manipulation signal are incident on the signal manipulation element. In an example embodiment, the first manipulation signal and the second manipulation signals are provided separately (e.g., not overlapping in time; this may be the case where the first state and the second state are different).

In various embodiments, a interaction control element is configured to be induced to emit an induced signal and/or beam responsive to an incoming manipulation signal and/or emitted signal within a corresponding wavelength range being incident thereon. For example, each function of a quantum computer and/or trapped particle system may be associated with one or more wavelengths. A respective signal manipulation element may therefore correspond to one or more functions of the quantum computer and/or trapped particle system, where the one or more functions of the quantum computer and/or trapped particle system correspond to wavelengths within the wavelength range at which the respective signal manipulation elements are configured to operate. In various embodiments, the state of the dynamic optical effect of an signal manipulation element may be determine which function of the quantum computer and/or trapped particle system the signal manipulation element is configured to perform at that point in time.

In various embodiments, with each signal manipulation element is associated with one or more corresponding particle positions defined by the confinement assembly. In various embodiments, one or more particle positions defined by the confinement assembly are associated with an arrangement of signal manipulation elements comprising a plurality of signal manipulation elements. In various embodiments, each signal manipulation element of an arrangement of signal manipulation elements associated with an confinement assembly is configured for use in performing one or more functions of the quantum computer and/or trapped particle system (e.g., photoionization, state preparation, qubit detection and/or reading, cooling, shelving, repumping, single qubit gates, two qubit gates, emitted signal detection, and/or the like). For example, performance of various functions of the quantum computer and/or trapped particle system may include use of manipulation signals and/or detection of stimulated signals of various wavelengths. Various signal manipulation elements and/or various states of various signal manipulation elements are configured for use at different wavelengths such that a particular signal manipulation element of an arrangement of signal manipulation elements is configured for use when performing one or more corresponding functions of the quantum computer and/or trapped particle system at the corresponding particle position.

In various embodiments, various incident signals and/or beams are generated close to the particle(s) and/or by the particles. For example, a particle may emit a stimulated signal that is incident on an signal manipulation element and causes an induced signal to be emitted toward a corresponding collection location. In another example, a manipulation source may be formed and/or disposed at least partially on and/or in the first substrate on which the confinement assembly is formed and/or disposed. In another example, a manipulation source may be formed and/or disposed at least partially on and/or in a second substrate that is mounted in a secured and/or controllable manner with respect to the confinement assembly. In various embodiments, one or more manipulation sources formed on and/or disposed at least partially in and/or one the first and/or second substrate comprise non-coherent optical sources. In various embodiments, one or more manipulation sources formed on and/or disposed at least partially in and/or one the first and/or second substrate comprise coherent optical sources.

Conventionally, laser beams are generated at distance from an ion trap and provided to locations within the ion trap by transmitting the laser beams parallel to the plane of the ion trap such that the laser beams are incident on the ions within the ion trap. However, for ion traps that are two dimensional and/or that have larger dimensions, it is difficult to focus a laser beam at the ions within the ion trap without clipping the edge of the ion trap. The larger the ion trap and the number of ions within the trap, the more technically difficult it becomes to address particular ions with a particular laser beam without disrupting other ions within the ion trap and with the required control over various aspects of the particular laser beam. Thus, a technical problem exists as to how to provide manipulation signals to particle positions defined by a confinement assembly that is able to scale with the size and/or dimensions of the confinement assembly and/or the number of particles trapped and/or confined by the confinement assembly.

Various embodiments provide technical solutions to these technical problems. In particular, in various embodiments, the manipulation signals are sent transverse (e.g., approximately perpendicular, at approximately a 45 degree angle, and/or the like) to the plane of the confinement assembly. For example, the manipulation signals are sent such that they are incident on a signal manipulation element and induce signal manipulation element to emit an induced signal that is directed toward the corresponding particle position. In other words, the signal management systems of various embodiments use signal manipulation elements to enable the manipulation signals to be provided transverse to the plane of the confinement assembly.

Moreover, various embodiments provide signal manipulation elements that have controllable optical effects. For example, the dynamically controllable optical effects are controlled and/or influenced by electrical signals, electric fields, incident signal and/or beam polarization, mechanical adjustments and/or movements (e.g., controlled via electrically controlled motors, actuators, and/or the like), temperature of the nano-photonic element, electro-optical effects, acousto-optical effects, photo-elastic effects, and/or the like. The induced signal and/or beam is characterized, at least in part, by properties that are determined based on the state of the dynamically controllable optical effects of the signal manipulation element when the induced signal and/or beam was emitted by the signal manipulation element. Some non-limiting examples of properties of the induced signal and/or beam that may be determined based on the state of the dynamically controllable optical effects of the signal manipulation element include beam position/angle (direction of propagation of the induced signal/beam), focal length, polarization, phase, frequency, beam pattern, and power (e.g., amplitude), chromatic filtering, and/or the like.

The dynamically controllable optical effects of the signal manipulation elements enable the signal manipulation elements to be used for modulation control (e.g., switching signals and/or beams on and/or off, tuning/optimizing signal and/or beam amplitude or power, tuning/optimizing signal and/or beam optical phase, tuning/optimizing signal and/or beam polarization, tuning/optimizing signal and/or beam frequency, beam steering/switching, adjusting focal length and/or focal shape, providing a fully reconfigurable hologram projection, and/or the like.

Thus, various embodiments provide technical solutions to technical problems regarding how to provide manipulation signals to particle positions defined by a confinement assembly such that manipulation signals are not sent parallel to the confinement assembly plane such that the manipulation signals may be effectively provided to a two-dimensional ion trap. Various embodiments provide further technical solutions by enabling the use of longer wavelength (e.g., infrared) manipulation signals that are used to generate induced signals of a desired frequency (e.g., visible and/or UV). Various embodiments provide further technical solutions by providing additional and configurable control over the application of manipulation signals to particle positions.

Additionally, detecting particle's quantum state also presents a challenge due to the large field of view required for the optics to collect and/or detect signals emitted by the particles within a large and/or two-dimensional confinement assembly. Various embodiments provide technical solutions to these technical problems by aiding in the collecting and/or directing emitted signals such that the signals emitted by the particles are more efficiently captured, detected, and/or measured. For example, signal manipulation elements may be disposed and/or configured such that, responsive to a stimulated signal emitted by a particle being incident on the signal manipulation element, an induced signal and/or beam is emitted toward a respective collection location. In various embodiments, collection optics and/or photodetectors may be located at the collection location such that information regarding the stimulated signal is captured. Thus, various embodiments provide a solution to the large field-of-view technical problem of determining quantum states of particles confined by a large and/or two-dimensional confinement assembly.

Figure 1:
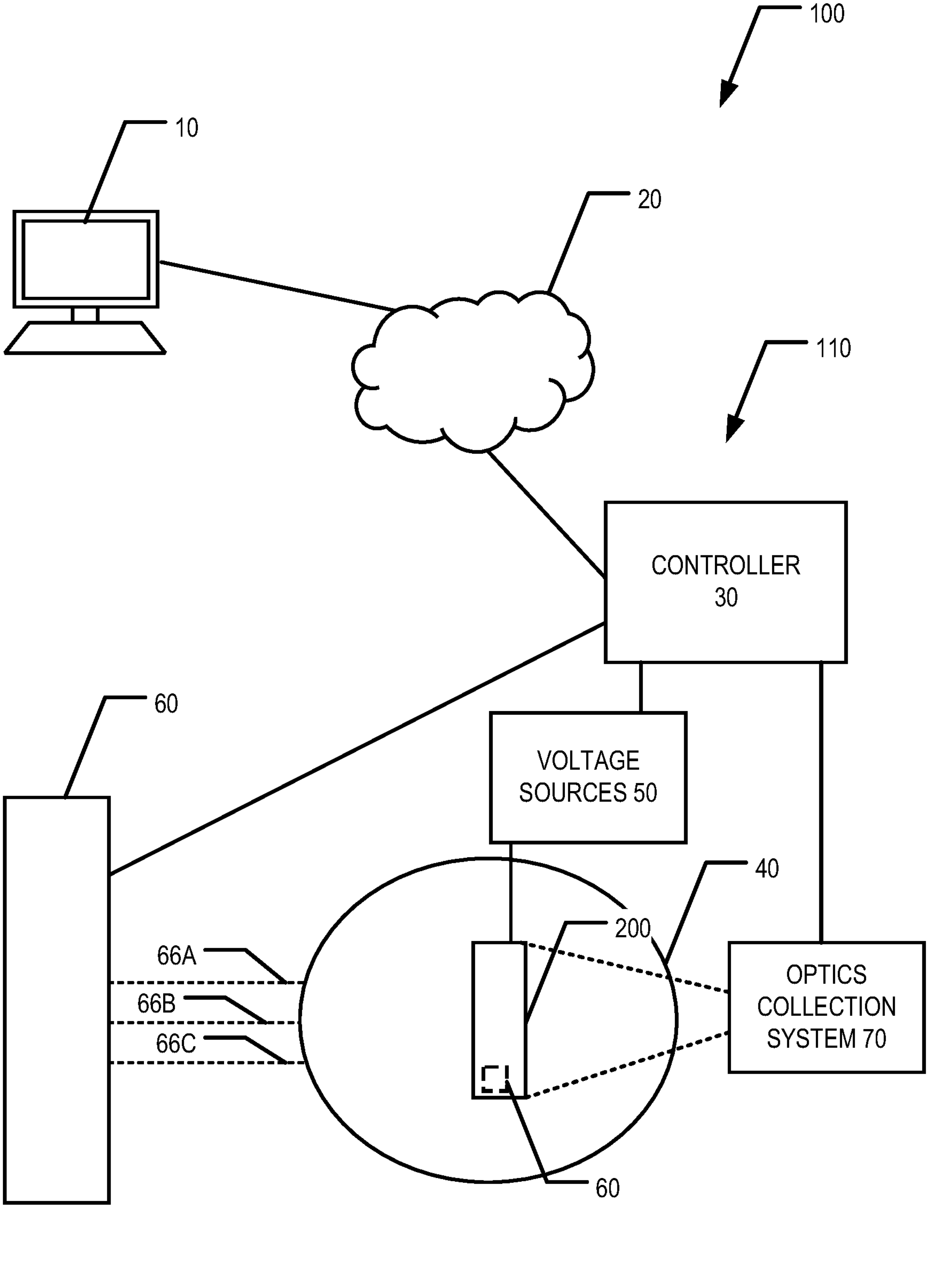
FIG. 1 is a schematic diagram illustrating an example quantum computing system comprising an quantum object confinement assembly comprising metamaterial structures on a surface thereof, according to an example embodiment.

Example Quantum Computing System Comprising an Quantum Object Confinement Assembly In various embodiments, signal manipulation elements comprising active nano-photonics that have controllable optical effects are used to interact with particles and/or cause/mediate interactions between particles. In various embodiments, the particles are trapped and/or confined quantum objects (e.g., atoms, ions, groups of atoms and/or ions, molecules, quantum particles, and/or the like), qubits (e.g., of a quantum processor and/or quantum computer), and/or the like. For example, in an example embodiment, the particles are trapped ions that are used as qubits of a quantum charge-coupled device (QCCD)-based quantum computer. FIG. 1 provides a schematic diagram of an example QCCD-based quantum computing system 100, in accordance with an example embodiment. Various other embodiments relate to quantum computers of various other architectures and/or other trapped particle systems.

FIG. 1 provides a schematic diagram of an example quantum computing system 100 comprising a confinement assembly 200 (e.g., an ion trap and/or the like), in accordance with an example embodiment. As shown in FIGS. 2-6, in various embodiments, the confinement assembly 200 comprises and/or is associated with a signal management system comprising a plurality of signal manipulation elements. As shown in FIGS. 2, 3, 5, and 6, in various embodiments, a plurality of signal manipulation elements are formed and/or disposed on a surface of the confinement assembly and/or at least partially embedded within the substrate on which the confinement assembly is formed and/or disposed.

In various embodiments, at least a portion of the signal manipulation elements formed and/or disposed on the surface of the confinement assembly are configured to be induced to emit an induced signal toward and/or focused onto a respective particle position responsive to an incoming signal being incident thereon. The incoming signal is at least a portion of a manipulation signal generated by a manipulation source 60 of the quantum computer 110. In various embodiments, at least one signal manipulation element formed and/or disposed on the surface of the confinement assembly is configured to be induced to emit an induced signal toward and/or focused onto a collection location (e.g., where corresponding collection optical elements are disposed) corresponding to the respective particle position responsive to an emitted signal emitted by particle located at the respective particle position being incident on the signal manipulation element. One or more properties of the induced signal are determined based on a state of the dynamically controllable optical effects of the signal manipulation element when the manipulation signal and/or stimulated signal was incident on the signal manipulation element and/or when induced signal was emitted by the signal manipulation element. Some non-limiting examples of properties of the induced signal and/or beam that may be determined based on the state of the dynamically controllable optical effects of the signal manipulation element include beam position/angle (direction of propagation of the induced signal/beam), focal length, polarization, phase, frequency, beam pattern, and power (e.g., amplitude), chromatic filtering, and/or the like.

In various embodiments, the quantum computing system 100 comprises a computing entity 10 and a quantum computer 110. In various embodiments, the quantum computer 110 comprises a controller 30, a cryostat and/or vacuum chamber 40 enclosing a confinement assembly 200 (e.g., an ion trap), and one or more manipulation sources 60. For example, the cryostat and/or vacuum chamber 40 may be a pressure-controlled chamber. In an example embodiment, the manipulation signals generated by the manipulation sources 60 are provided to the interior of the cryostat and/or vacuum chamber 40 (where the quantum object confinement assembly 200 is located) via corresponding optical paths 66 (e.g., 66A, 66B, 66C). In various embodiments, the optical paths 66 are defined, at least in part by one or more components and/or elements of the signal management system. For example, at least one of the optical paths 66 comprises and/or is in part defined by a signal manipulation element of the signal management system.

In an example embodiment, at least one manipulation source 60 is disposed within the cryostat and/or vacuum chamber 40. For example, in an example embodiment, one or more manipulation sources 60 are formed and/or disposed at least in part on and/or in the first substrate on which the confinement assembly 200 is formed and/or disposed and/or on a second substrate that is mounted in a secured and/or controllable manner with respect to the confinement assembly 200 within the cryostat and/or vacuum chamber 40.

In an example embodiment, the one or more manipulation sources 60 may comprise one or more coherent optical sources and/or one or more incoherent optical sources. For example, in an example embodiment, the one or more manipulation sources 60 comprise one or more lasers (e.g., optical lasers, microwave sources, VECSELs, VCSELs, and/or the like). In various embodiments, each manipulation source 60 is configured to generate a manipulation signal having a respective characteristic wavelength in the microwave, infrared, visible, or ultraviolet portion of the electromagnetic spectrum. In various embodiments, the one or more manipulation sources 60 are configured to manipulate and/or cause a controlled quantum state evolution of one or more particles confined and/or trapped by the confinement assembly 200. For example, in an example embodiment, wherein the one or more manipulation sources 60 comprise one or more lasers, the lasers may provide one or more laser beams (e.g., as manipulation signals) to particles confined and/or trapped by the confinement assembly 200 within the cryostat and/or vacuum chamber 40.

For example, a manipulation source 60 generates a manipulation signal that is provided as an incoming signal to an appropriate signal manipulation element of the signal management system. The incoming signal being incident on the signal manipulation element, for example an active metamaterial array (e.g., having one or more dynamically controllable optical effects), induces the plurality of metamaterial structures of the metamaterial array to emit an induced signal directed toward and/or focused at a corresponding particle position of the confinement assembly. For example, the manipulation sources 60 may be configured to generate one or more manipulations signals and/or beams that may be used to initialize a particle into a state of a qubit space such that the particle may be used as a qubit of the quantum computer 110, perform one or more gates on one or more qubits of the quantum computer 110, read and/or determine a state of one or more qubits of the quantum computer 110, and/or the like.

In various embodiments, the manipulation signals are configured to cause performance of various functions of the quantum computer 110 and/or other trapped particle system on one or more particles. An example function that may be performed on particle is photoionization of the quantum object. For example, a manipulation signal may be applied to the particle (e.g., via one or more signal manipulation elements) to photo-ionize the particle.

Another example function that may be performed on particle is state preparation of the particle. For example, one or more manipulation signals may be applied to the particle (e.g., via one or more signal manipulation elements) to prepare the particle in a particular quantum state. For example, the particular quantum state may be a state within a defined qubit space used by the quantum computer such that the particle may be used as a qubit of the quantum computer.

Another example function that may be performed on a particle is reading a quantum state of the particle. For example, a manipulation signal (e.g., a reading signal) may be applied to the particle (e.g., via one or more signal manipulation elements). When the particle's wave function collapses into a first state of the qubit space, the particle will fluoresce in response to the reading signal being applied thereto. When the particle's wave function collapses into a second state of the qubit space, the particle will not fluoresce in response to the reading signal being applied thereto.

Another example function that may be performed on a particle is cooling the particle or a particle crystal comprising the particle. A particle crystal is a pair or set of particles where one of the particles of the particle crystal is qubit particle used as a qubit of the quantum computer and the one or more other particles of the particle crystal are used to perform sympathetic cooling of the qubit particle. For example, a manipulation signal (e.g., a cooling signal or a sympathetic cooling signal) may be applied to the particle or particle crystal (e.g., via one or more signal manipulation elements) to cause the (qubit) particle to be cooled (e.g., reduce the vibrational and/or other kinetic energy of the (qubit) particle).

Another example function that may be performed on a particle is shelving the particle. In various embodiments, particles in the second state of the qubit space may be shelved during the performance of a reading function. For example, a shelving operation may comprise causing the quantum state of an particle in the second state of the qubit space to evolve to an at least meta-stable state outside of the qubit space while a reading operation is performed. An example shelving process is describe by U.S. Application No. 63/200,263, filed Feb. 25, 2021, though various other shelving processes may be used in various embodiments. In various embodiments, the shelving of particle is performed by applying one or more manipulation signals (e.g., via one or more signal manipulation elements) to the particle to cause the particle's quantum state to evolve to an at least meta-stable state outside of the qubit space when the particle is in the second state of the qubit space.

Another example function that may be performed on a particle is (optical) repumping of the particle. In various embodiments, repumping of the particle comprises applying one or more manipulation signals (e.g., via one or more signal manipulation elements) to the particle to cause the quantum state of the particle to evolve to an excited state.

Another example function that may be performed on a particle is performing a single qubit gate on the particle. For example, one or more manipulation signals may be applied to the particle (e.g., via one or more signal manipulation elements) to perform a single qubit quantum gate on the particle.

Another example function that may be performed on a particle is performing a two qubit gate on the particle. For example, one or more manipulation signals may be applied to a pair or set of particles that includes the particle (e.g., via one or more signal manipulation elements) to perform a two qubit (or three, four, or more qubit) quantum gate on the particle and the at least one other particle.

In various embodiments, the quantum computer 110 comprises an optics collection system 70 configured to collect and/or detect photons generated by qubits (e.g., during reading procedures). The optics collection system 70 may comprise one or more optical elements (e.g., lenses, mirrors, waveguides, fiber optics cables, and/or the like) and one or more photodetectors. In various embodiments, the photodetectors may be photodiodes, photomultipliers, charge-coupled device (CCD) sensors, complementary metal oxide semiconductor (CMOS) sensors, Micro-Electro-Mechanical Systems (MEMS) sensors, and/or other photodetectors that are sensitive to light at an expected fluorescence wavelength of the qubits of the quantum computer. In various embodiments, the detectors may be in electronic communication with the controller 30 via one or more A/D converters 1425 (see FIG. 14) and/or the like. For example, a particle being read and/or having its quantum state determined may emit a stimulated signal, at least a portion of which is incident on an signal manipulation element of the signal management system. The incident signal being incident on the signal manipulation element induces the signal manipulation element to emit an induced signal directed toward and/or focused at collection optics of the confinement assembly and located at the collection location corresponding to the particle position that the particle is occupying. The collection optics are configured to provide the collection signal to a photodetector.

In various embodiments, the quantum computer 110 comprises one or more voltage sources 50. For example, the voltage sources 50 may comprise a plurality of voltage drivers and/or voltage sources and/or at least one RF driver and/or voltage source. The voltage sources 50 may be electrically coupled to the corresponding potential generating elements (e.g., electrodes) of the confinement assembly 200, in an example embodiment.

In various embodiments, a computing entity 10 is configured to allow a user to provide input to the quantum computer 110 (e.g., via a user interface of the computing entity 10) and receive, view, and/or the like output from the quantum computer 110. The computing entity 10 may be in communication with the controller 30 of the quantum computer 110 via one or more wired or wireless networks 20 and/or via direct wired and/or wireless communications. In an example embodiment, the computing entity 10 may translate, configure, format, and/or the like information/data, quantum computing algorithms and/or circuits, and/or the like into a computing language, executable instructions, command sets, and/or the like that the controller 30 can understand and/or implement.

In various embodiments, the controller 30 is configured to control the voltage sources 50, cryostat system and/or vacuum system controlling the temperature and pressure within the cryostat and/or vacuum chamber 40, manipulation sources 60, optics collection system 70, states of various signal manipulation elements, and/or other systems controlling various environmental conditions (e.g., temperature, pressure, and/or the like) within the cryostat and/or vacuum chamber 40 and/or configured to manipulate and/or cause a controlled evolution of quantum states of one or more particles within the confinement assembly. For example, the controller 30 may cause a controlled evolution of quantum states of one or more particles within the confinement assembly to execute a quantum circuit and/or algorithm. For example, the controller 30 may cause a reading procedure comprising coherent shelving to be performed, possibly as part of executing a quantum circuit and/or algorithm. In various embodiments, the particles are confined within the confinement assembly are used as qubits of the quantum computer 110.

Example Signal Management Systems

In various embodiments, a signal management system is configured to control the provision and/or collection of signals to and/or from respective particle positions defined by the confinement assembly 200. In various embodiments, the signal management system defines optical paths used to provide signals to respective particle positions and/or collection locations. The optical paths comprise respective signal manipulation elements. In various embodiments, the signal manipulation elements are configured to enable the optical paths to be transverse to the surface 208 of the 200 confinement assembly (see FIG. 2).

Various embodiments are disclosed where the surface 208 of the confinement assembly 200 comprises one or more signal manipulation elements. For example, in various embodiments, the surface 208 of the confinement assembly 200 comprises an arrangement of signal manipulation elements for each particle position 250 defined by the confinement assembly 200. Various embodiments are disclosed where the first substate 205, upon which the confinement assembly 200 is formed is transparent at one or more wavelengths and/or comprises waveguides and/or vias through which an incoming manipulation signal and/or an outgoing induced signal may propagate. Various embodiments are disclosed where a second substrate 405 is mounted in a secured and/or controllable relationship to the confinement assembly 200 and signal manipulation elements (and/or arrangements of signal manipulation elements) are formed and/or disposed on a surface of the second substrate(see an example of such in FIG. 4).

In various embodiments, a signal manipulation element comprises an active nano-photonics device, component, surface, array, and/or the like. Some example active nano-photonics devices, components, surfaces, arrays, and/or the like include metasurfaces, metamaterials, photonic crystals, diffractive optical elements, microfabricated surfaces configured to perform signal control functions (e.g., reflection, refraction, diffraction, and/or the like), and/or the like that have dynamically controllable optical effects. In various embodiments, one or more properties of an induced signal emitted by a signal manipulation element are determined based on a state of the dynamically controllable optical effects of the nano-photonics device, component, surface, array, and/or the like of the signal manipulation element. Some non-limiting examples of properties of the induced signal and/or beam that may be determined based on the state of the dynamically controllable optical effects of the nano-photonics device, component, surface, array, and/or the like of the signal manipulation element (also referred to herein as the state of the dynamically controllable optical effects of the signal manipulation element) include beam position/angle (direction of propagation of the induced signal/beam), focal length, polarization, phase, frequency, beam pattern, and power (e.g., amplitude), and/or the like.

Figure 2:
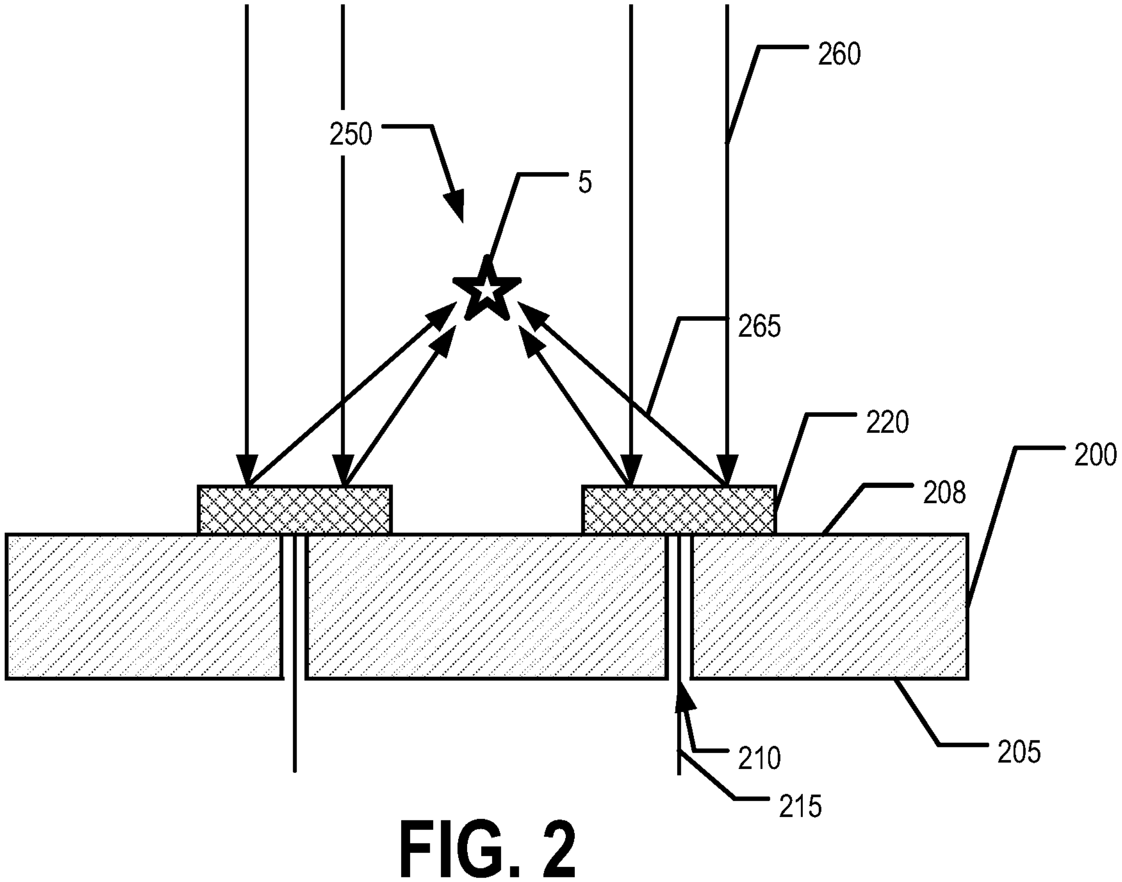
FIG. 2 is a partial cross-sectional view of a confinement assembly comprising an signal manipulation element configured to apply an induced signal to a particle position defined by the confinement assembly, according to an example embodiment.
Figure 3:
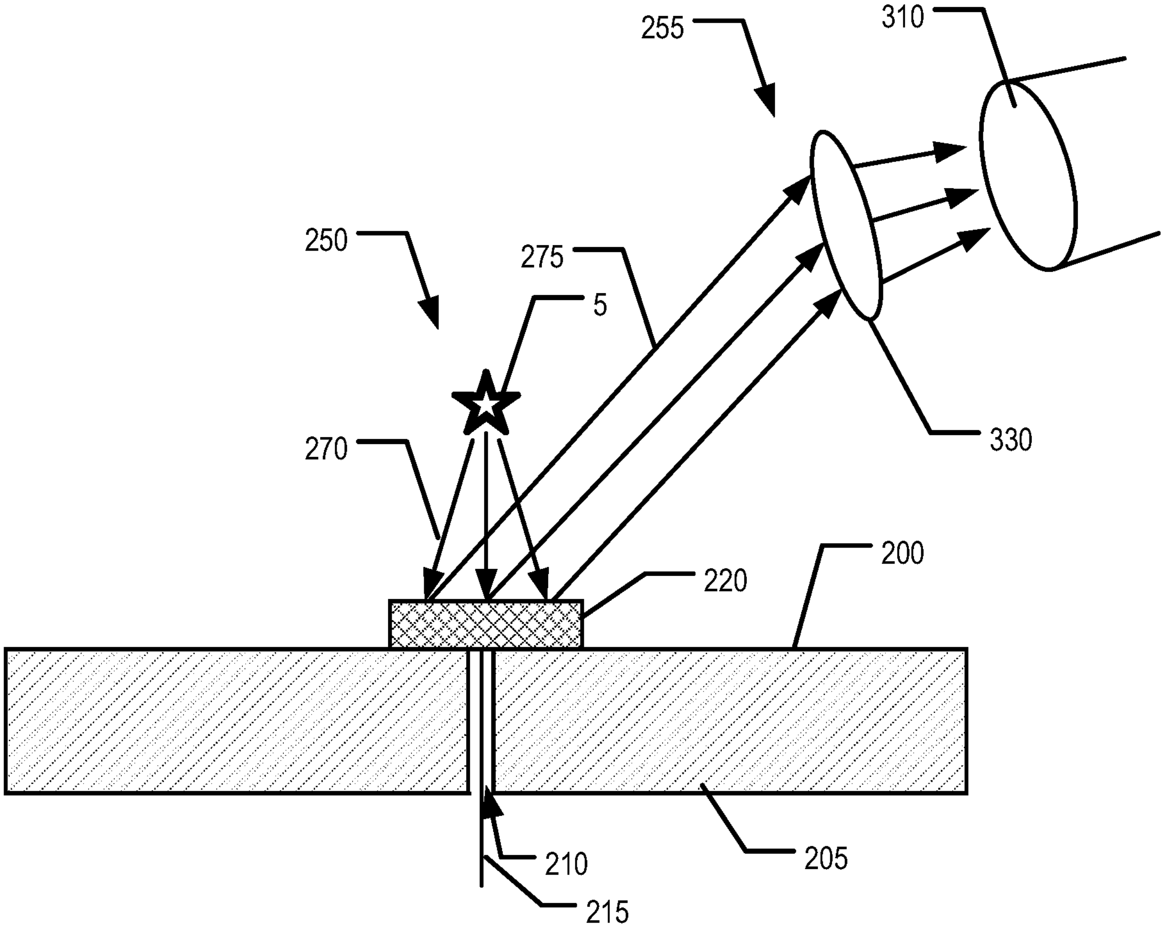
FIG. 3 is a partial cross-sectional view of a confinement assembly comprising an signal manipulation element configured to apply an induced signal to a collection location corresponding to a particle position defined by the confinement assembly, according to an example embodiment.

FIGS. 2 and 3 illustrate example embodiments in which the signal manipulation element(s) 220 are formed, deposited, and/or disposed on the surface 208 of a confinement assembly 200. FIG. 2 illustrates a partial cross-sectional view of a confinement assembly 200 wherein signal manipulation elements 220 are used to apply manipulation signals to particle position 250. For example, the controller 30 controls one or more manipulation sources 60 to generate manipulation signals. The manipulation signals are provided to the confinement assembly 200 as incoming and/or incident signals 260 propagating transverse to a plane defined by a surface 208 of the confinement assembly 200 such that the incoming and/or incident signals 260 are incident on the signal manipulation elements 220. The incoming and/or incident signals 260 being incident on the signal manipulation elements 220 cause respective induced signals 265 to be emitted toward the corresponding particle position 250. For example, the induced signal 265 is incident on a particle 5 located at the particle position 250. For example, the signal manipulation elements 220 shown in FIG. 2 are action elements. As used herein, an action element is a signal manipulation element configured to, responsive to an incoming signal generated by a manipulation source 60 being incident on the action element, provide an induced action signal to the respective particle position. In the illustrated embodiment, the action elements are formed on portions of the surface 208 of the confinement assembly 200.

The signal manipulation elements 220 comprise active nano-photonics having dynamically controllable optical effects. In an example embodiment, the dynamically controllable optical effects of a signal manipulation element 220 are configured such that a state of the dynamically controllable optical effects may be changed, adjusted, modified, controlled, and/or the like by applying an electrical signal to at least a portion of the signal manipulation element 220. For example, a via 210 is defined, formed, and/or etched through the first substrate 205 to enable a lead and/or control line 215 to provide a controlling electrical signal to the signal manipulation element 220. For example, the controller 30 may control a voltage source 50 to apply a controlling electric signal to the signal manipulation element 220 via the control line 215 extending through via 210.

As should be understood, various dynamically controllable optical effects are controlled through various means. For example, the dynamically controllable optical effects are controlled and/or influenced by electrical signals, electric fields, magnetic fields, incident signal and/or beam polarization, incident signal and/or beam frequency, incident signal and/or beam power, mechanical adjustments and/or movements (e.g., controlled via electrically controlled motors, actuators, and/or the like), temperature of the nano-photonic element, electro-optical effects, acousto-optical effects, photo-elastic effects, and/or the like, in various embodiments. The first substrate 205 may be modified and/or comprise components configured to enable the control of the dynamically controllable optical effects by the controller 30, for example (possibly via one or more intervening components such as voltage source 50 and/or the like), as appropriate for the application.

FIG. 3 illustrates a partial cross-sectional view of a confinement assembly 200 wherein a signal manipulation element 220 is used to collect an emitted and/or stimulated signal generated by a particle 5 at a respective particle position 250. For example, during a qubit reading function, for example, particle 5 located at the particle position 250 may be caused to emit an emitted and/or stimulated signal 270. At least a portion of the emitted and/or stimulated signal 270 is incident on a signal manipulation element 220. The at least a portion of the emitted and/or stimulated signal 270 being incident on the signal manipulation element 220 causes an induced collection signal 275 to be emitted from the signal manipulation element 220 and toward a corresponding collection location 255. In various embodiments, collection optics are located and/or disposed at the collection location 255. For example, in the illustrated embodiment, the collection optics comprise one or more optical elements, such as collection lens 330 configured to couple at least a portion of the collection signal 275 into a collection fiber 310.

For example, the signal manipulation element 220 shown in FIG. 3 is a collection element. As used herein, a collection element is a signal manipulation element 220 configured to, responsive to an emitted and/or stimulated signal 270 emitted by an particle located at the corresponding particle position being incident on the collection element, provide an induced collection signal 275 to the corresponding collection location 255. In various embodiments, the collection element is configured to provide an induced collection signal (responsive to an emitted signal being incident thereon) that is collimated toward, focused at, and/or the like the collection optics located at a collection location 255 corresponding to the respective particle position 250.

In various embodiments, a collection element is generally disposed between the corresponding particle position 250 and the surface 208 of the confinement assembly 200. In various embodiments, a collection element is configured to collect emitted and/or stimulated signal 270 from a large solid angle about the respective particle position 250. For example, the collection element may be positioned and sized to collect and/or have incident thereon emitted and/or stimulated signal emitted into approximately and/or approaching $2\pi$ steradians. For example, from the perspective of a particle position 250, the collection element may comprise more than $\pi$, $1.25\pi$, $1.5\pi$, $1.75\pi$, and/or approximately $2\pi$ steradians of solid angle about the particle position 250.

Figure 4:
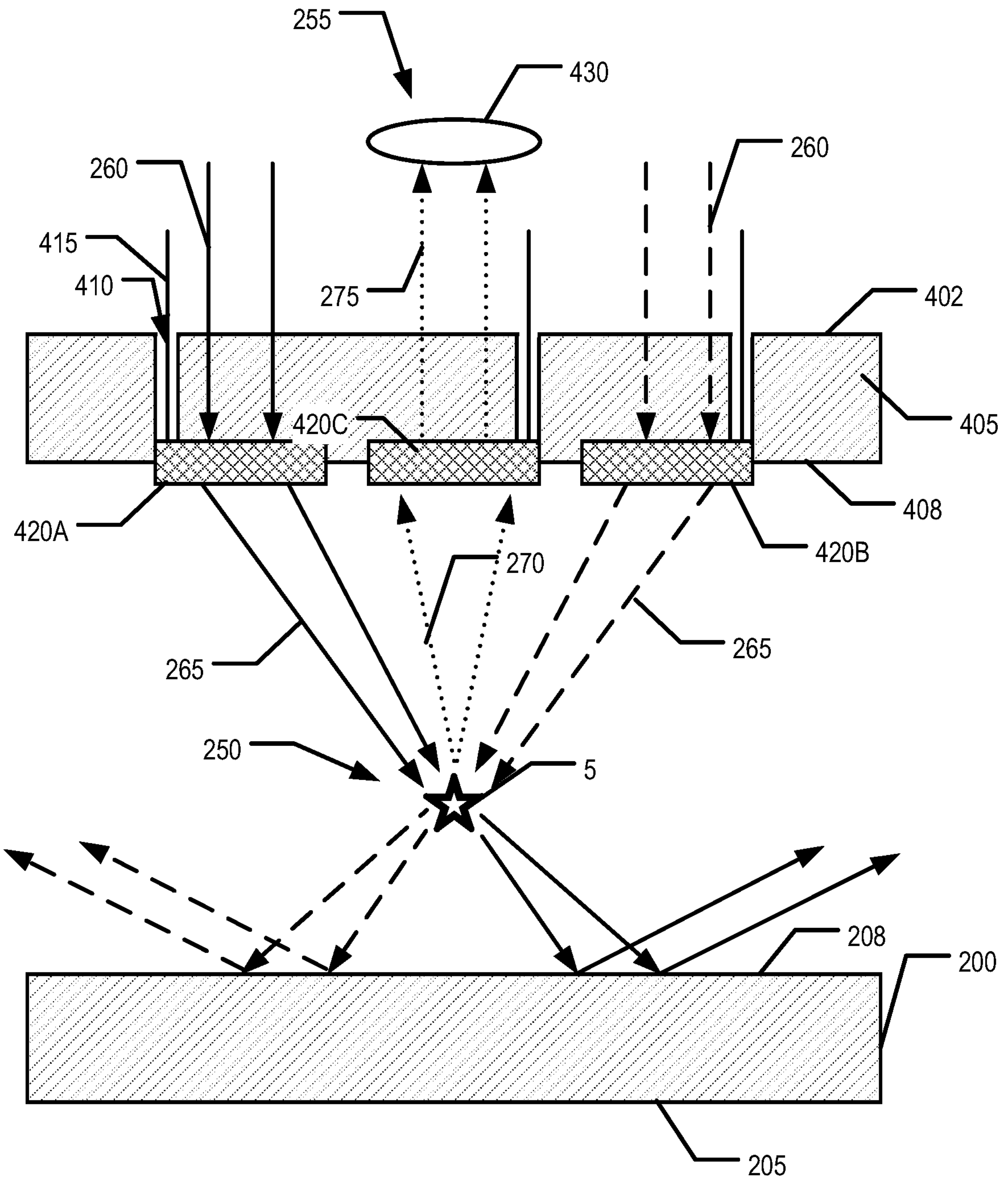
FIG. 4 is a schematic diagram of a flip chip signal delivery arrangement where a second substrate comprising signal manipulation elements is mounted in a secured relationship with respect to the confinement assembly, according to an example embodiment.

FIG. 4 illustrates another configuration where a second substrate 405 having one or more signal manipulation elements 420 (e.g., 420A, 420B, 420C) formed and/or disposed thereon and/or therein is mounted in a secured and/or controllable relationship with respect to the confinement assembly 200 such that manipulation signals can be provided to the particle positions 250 via respective signal manipulation elements 420 of the second substrate 405. For example, one or more action elements 420A, 420B are formed and/or disposed on a first surface 408 of the second substrate 405, in an example embodiment. For example, one or more collection elements 420C are formed and/or disposed on the first surface 408 of the second substrate 405, in an example embodiment. In an example embodiment, one or more action elements 420A, 420B and/or collection elements 420C are recessed and/or formed within the second substrate 405. The signal manipulation elements 420 are transparent signal manipulation elements. In an example embodiment, the signal manipulation elements 420 are formed on the second surface 402 of the second substrate 405 and/or within the second substrate 405 (e.g., between the second surface 402 and the first surface 408).

In various embodiments, the second substrate 405 is transparent to light of various wavelengths, where the various wavelengths include wavelengths that may be used to perform one or more functions of the quantum computer or other trapped particle system and/or wavelengths of the emitted and/or stimulated signal. For example, the second substrate 405 is transparent to light of various wavelengths that characterize respective manipulation signals used by the quantum computer or other trapped particle system, in an example embodiment. In an example embodiment, the second substrate 405 comprises waveguides, vias, and/or the like, that allow light to pass through the second substrate from a second surface 402 of the second substrate 405 to a first surface 408 of the second substrate 405, where the first surface 408 of the second substrate 405 faces the confinement assembly 200.

For example, manipulation signals are provided to the confinement assembly 200 via the second surface 402 of the second substrate 405. The manipulation signals propagate through the second substrate 405 from the second surface 402 to the first surface 408 (e.g., through the bulk material of the second substrate 405, a waveguide, a via, and/or the like). The manipulation signals are incident on respective action elements 420A, 420B. For example, the signal manipulation elements 420 are active nano-photonic lenses, which are lenses, lens-like photonic metasurfaces, and/or the like. For example, the action elements 420A, 420B act and/or function as lenses, resulting in the action signals being incident on the particle 5 located at the particle position 250. In various embodiments, the action elements 420A, 420B cause the respective action signals to have respective particular polarizations, phases, beam profiles (e.g., beam spot size at the particle position 250, intensity profile across the beam at the particle position, and/or the like), and/or the like. Once the action signals are incident on and/or pass through the particle position 250, the action signals reflect off of the surface 208 of the confinement assembly 200. In an example embodiment, an area of the second surface 402 corresponding to the particle position 250 is illuminated with one or more manipulation signals and the action elements 420*a*, 420B perform chromatic filtering such that the appropriate action signals are provided to the particle position 250 in an appropriate manner for the function to be performed.

In various instances, the particle 5 located at the particle position 250 may emit an emitted and/or stimulated signal 270. The emitted signal is incident on the collection element 420C. The collection element 420C acts as a lens and provides a focused and/or collimated collection signal 275 through the second substrate 405 from the first surface 408 to the second surface 402 thereof (e.g., through the bulk material of the second substrate 405, a waveguide, a via, and/or the like). The collection optics 430 may be disposed proximate the second surface 402 of the second substrate 405 such that the collection signal 275 is incident on the collection optics 430 corresponding to the particle position 250 to enable detection of the emitted and/or stimulated signal.

In an example embodiment, the action elements are disposed and/or formed on the second substrate 405, as shown in FIG. 4, and the collection elements are disposed and/or formed on the first substrate 205 (e.g., on the surface 208 of the confinement assembly 200), similar to as shown in FIG. 3. In an example embodiment, the action elements are disposed and/or formed on the first substrate 205 (e.g., on the surface 208 of confinement assembly 200), similar to as shown in FIG. 2, and the collection elements are formed on the second substrate 405, as shown in FIG. 4. In another example embodiment, some of the action elements are disposed and/or formed one the first substate 205 and some of the action elements are disposed and/or formed on the second substrate 405. For example, the first substrate 205 may be transparent to light characterized by wavelengths of a first wavelength range and the second substrate 405 may be transparent to light characterized by wavelengths of a second wavelength range. Action elements (and/or other signal manipulation elements) corresponding to wavelengths in the first wavelength range may be formed and/or disposed on the first substrate 205 such that the corresponding manipulation signals may propagate through the first substrate to the respective action elements and action elements (and/or other signal manipulation elements) corresponding to the wavelengths in the second wavelength range may be formed and/or disposed on the second substrate 405 such that the corresponding manipulation signals may propagate through the second substrate to the respective action elements.

In various embodiments, at least some of the signal manipulation elements 420 comprise active nano-photonics having dynamically controllable optical effects. In an example embodiment, the dynamically controllable optical effects of a signal manipulation element 420 are configured such that a state of the dynamically controllable optical effects may be changed, adjusted, modified, controlled, and/or the like by applying an electrical signal to at least a portion of the signal manipulation element 420. For example, a via 410 is defined, formed, and/or etched through the second substrate 405 to enable signal line 415 to provide a controlling electrical signal to the signal manipulation element 420. For example, the controller 30 may control a voltage source 50 to apply a controlling electric signal to the signal manipulation element 420 via the signal line 415 extending through via 410. In another example, a signal line 415 may be formed as a lead and/or trace on the first surface 408 of the second substrate such that the signal line 415 is in electrical communication and/or operably connected with the signal manipulation element 420 and the controller 30 (e.g., possibly via a voltage source 50 and/or the like).

At least one of the signal manipulation elements 220, 420 comprise active non-photonics, such as metasurfaces, metamaterials, photonic crystals, diffractive optical elements, microfabricated surfaces configured to perform signal control functions (e.g., reflection, refraction, diffraction, and/or the like), and/or the like, that have dynamically controllable optical effects. In various embodiments, the dynamically controllable optical effects of a signal manipulation element are controlled and/or influenced by a change in one or more physical parameters of and/or affecting the signal manipulation element. Some example physical parameters that may be used to control and/or influence the state of a dynamically controllable optical effect of a signal manipulation element include electrical signals, electric fields, incident signal and/or beam polarization, mechanical adjustments and/or movements (e.g., controlled via electrically controlled motors, actuators, and/or the like), temperature of the nanophotonic element, electro-optical effects, acousto-optical effects, photo-elastic effects, and/or the like, in various embodiments.

In various embodiments, at least one signal manipulation element 220, 420 comprises an active metasurface. In various embodiments, the active metasurface is coated and/or encapsulated in an encapsulating material. The optical effects of the active metasurface are strongly dependent on the refractive index contrast between the metasurface and the encapsulating material. Thus, modifying the refractive index of the metasurface and/or the encapsulating material results in a change in the state of the dynamically controllable optical effects of the corresponding signal manipulation element.

In various embodiments, the metasurface is a solid state metasurface and the refractive index of the metasurface or the encapsulating material is modifiable and/or controlled by electrically or optically modifying the concentration of free charge carriers in bulk material of the metasurface or the encapsulating material. For example, the state of the dynamically controllable optical effects of the corresponding signal manipulation element may be modified and/or controlled through application of an controlling electrical signal and/or a controlling optical signal. For example, in an example embodiment, at least one signal manipulation element 220, 420 comprises a passive metasurface and a cladding of the metasurface and/or a substrate portion on which the metasurface is formed and/or disposed, where the cladding or the substate portion has controllable optical properties (e.g., a controllable index of refraction). For example, in an example embodiment, at least one signal manipulation element comprises a passive metasurface and an optically active cladding and/or is formed on an optically active substrate portion (e.g., the cladding and/or the substrate portion have a dynamically controllable refractive index).

In various embodiments, the encapsulating material of the metasurface is a liquid crystal material. The refractive index of the liquid crystal encapsulating material may be modified through application of a controlling electrical signal to the signal manipulation element.

In various embodiments, the metasurface and/or the encapsulating material comprises a phase change material (e.g., vanadium dioxide ($VO_2$)) having a refractive index that is temperature, or electrical or optical interaction dependent. For example, the state of the dynamically controllable optical effects of the corresponding signal manipulation element may be modified and/or controlled through application of a controlling electrical signal, controlling electric field, controlling magnetic field, and/or a controlling optical signal to the signal manipulation element or by controlling the temperature of the signal manipulation element.

In various embodiments, various electro-optic, acousto-optic, or photo-elastic effects are used to control the refractive index of the metasurface and/or the encapsulating material, as appropriate for the application. For example, a signal manipulation element may include an array of metasurface elements (e.g., pillars and/or holes), a surface or substrate on which the metasurface elements are formed, and/or cladding disposed around and/or between the metasurface elements (or in the metasurface elements in the case where the metasurface elements are holes), in an example embodiment. The electro-optic, acousto-optic, or photo-elastic effects may affect the refractive index of the metasurface elements, the surface or substrate on which the metasurface elements are formed, and/or the cladding. For example, in an example embodiment, the cladding is a liquid crystal cladding where the refractive index of the liquid crystal cladding may be modified and/or controlled via application of an electric field or magnetic field thereto.

In various embodiments, one or more physical parameters of the active nano-photonics of the signal manipulation element are changed through mechanical deformation. For example, when the active nano-photonics include an active metasurface, the physical sizes of the metasurface elements (e.g., pillars and/or holes) and/or the spacing of the metasurface elements may be modified to control the state of the dynamically controllable optical effects of the signal manipulation element.

For example, piezoelectric effects or material thermal expansion is used, in an example embodiment, to modify the size, shape, and/or spacing of metasurface elements of a metasurface of an example signal manipulation element.

In another example, a metasurface is coating and/or encapsulated with an elastic and/or resilient encapsulating material. A mechanical strain may be applied to the elastic and/or resilient encapsulating material (e.g., the material may be pulled/stretched and/or compressed in one more directions) to control the state of the dynamically controllable optical effects of the signal manipulation elements.

In an example embodiment, the relative tilt of a metasurface (e.g., relative to the surface 208 of the first substrate 205 or the first surface 408 of the second substrate 405) may be used to control the incident angle of a signal incident on the signal manipulation element. For example, controlling the incident angle of the signal incident on the signal manipulation element may be used to modify the metasurface effect (e.g., to control the state of the dynamically controllable optical effects of the signal manipulation element) and/or to perform beam steering. In various embodiments, the relative tilt of the signal manipulation element and/or a metasurface thereof is performed macroscopically (e.g., with a macroscopic actuator, motor, and/or the like) or using a microelectromechanical system (MEMS).

In various embodiments, the one or more physical parameters of the active nano-photonics of the signal manipulation element are changed through polarization rotation of the incident signal and/or beam. For example, the state of the dynamically controllable optical effects of the signal manipulation element is determined based on the polarization of the signal and/or beam incident on the signal manipulation element. For example, an example metasurface of a signal manipulation element is configured and/or designed to have a polarization-dependent effect. For example, the example metasurface is configured and/or designed to focus light at an off-axis angle of +10 degrees for a signal or beam with a first polarization and −10 degrees for a signal or beam with a second polarization, where the first polarization and the second polarization are orthogonal to one another. The state of the dynamically controllable optical effects of the signal manipulation element may therefore be controlled by adjusting the polarization of the incident signal. For example, the polarization of the incident signal or beam is used to selectively distribute the induced signal between the two focal points. This could be used for amplitude tuning, switching between providing the induced signal to two different particle positions, effective beam steering, and/or the like.

In various embodiments, the one or more physical parameters of the active nano-photonics of the signal manipulation element are changed in response to the power or power range of the incident signal and/or a frequency and/or frequency range present in the incident signal. For example, an example metasurface of a signal manipulation element is configured and/or designed to have a frequency and/power dependent effect. For example, the example metasurface may be configured and/or designed to focus light at an off-axis angle of +10 degrees for a signal or beam characterized by a frequency profile within a particular frequency range and −10 degrees for a signal or beam with characterized by a frequency profile not within the particular frequency range.

In various embodiments, the one or more physical parameters of the active nano-photonics of the signal manipulation element are changed through variable optical loss. For example, materials with tunable optical absorption are used, in various embodiments, to modulate amplitude of the induced signal or beam and/or to switch the induced signal between "on" and "off." For example, $VO_2$, an example phase change material with an insulating-metal transition is used in an example embodiment to enable variable optical loss control of the state of the dynamically controllable optical effects of the signal manipulation element. For example, the optical absorption of a wide range of wavelengths substantially changes when the phase change material (e.g., $VO_2$) undergoes the phase transition, the phase transition may be used to control the dynamically controllable optical effects of the signal manipulation element comprising the phase change material.

The dynamically controllable optical effects of the signal manipulation elements enable the signal manipulation elements to be used for modulation control (e.g., switching signals and/or beams on and/or off, tuning/optimizing signal and/or beam amplitude or power, tuning/optimizing signal and/or beam optical phase, tuning/optimizing signal and/or beam polarization, tuning/optimizing signal and/or beam frequency, beam steering/switching, adjusting focal length and/or focal shape, providing a fully reconfigurable hologram projection, and/or the like.

For example, in various embodiments, the state of the dynamically controllable optical effects of a signal manipulation element may be used as a modulator for passing a signal to a corresponding particle position (e.g., providing the induced signal to the particle position) or rejecting a signal (e.g., not providing the induced signal to the particle position). For example, in an example embodiment, a single manipulation source may be coupled to several signal manipulation elements and the respective states of the signal manipulation elements (e.g., the dynamically controllable optical effects thereof) are used to control to which particle positions induced beams are applied and/or provided. Such a feature may be particularly helpful with large confinement assemblies confining and/or trapping a large number of particles therein. In another example, a manipulation signal generated by a manipulation source 60 may be split into a plurality of signals and/or beams. The signal manipulation elements 220, 420 may be used to control the amplitude, phase, frequency, and polarization of the induced signals and/or beams that are incident on the particles 5 at the respective particle positions 250. In various embodiments, states of the dynamically controllable optical effects resulting in such a modulation effect are controlled through tunable transmittance/reflectance and/or tunable absorption of the signal manipulation elements.

In various embodiments, the state of the dynamically controllable optical effects of a signal manipulation element may be used as a modulator for controlling, tuning, optimizing, and/or the like the amplitude or optical power of the induced signal or beam. For example, a signal manipulation source may be used to provide incoming signals or beams to a plurality of signal manipulation elements and the amplitude or optical power of the respective induced signals or beams is controlled based via the respective states of the dynamically controllable optical effects of the respective signal manipulation elements. For example, the amplitude or optical power of an induced signal or beam that is to be provided to a particle position in coordination with another induced signal or beam to be provided to the same particle position (e.g., to perform a two qubit gate or other function that requires coordinated provisioning of the multiple manipulation signals) may be controlled and/or balanced in accordance with the function requirements. In various embodiments, states of the dynamically controllable optical effects resulting in such an amplitude and/or optical power control effect are controlled through tunable transmittance/reflectance and/or tunable absorption of the signal manipulation elements.

In various embodiments, the state of the dynamically controllable optical effects of a signal manipulation element may be used as a modulator for controlling, tuning, optimizing, and/or the like the phase of the induced signal or beam. For example, the state of the dynamically controllable optical effects of a signal manipulation element is used to control the phase of an induced signal applied to a particle position. In an example embodiment, phase control, tuning, and/or optimization of a manipulation signal may be used to generate an amplitude tuning effect through interference (constructive or destructive) with another coherent signal and/or beam.

In various embodiments, the state of the dynamically controllable optical effects of a signal manipulation element may be used as a modulator for controlling, tuning, optimizing, and/or the like the polarization of the induced signal or beam. Various particle interactions are strongly dependent on polarization of the signal or beam incident on the particle(s). In various embodiments, the signal manipulation element provides active fine-adjustment control of the polarization of the induced signal. In an example embodiment, control of the polarization of an induced signal or beam is used as an alternative to amplitude modulation for polarization dependent interactions.

In various embodiments, the state of the dynamically controllable optical effects of a signal manipulation element may be used as a modulator for controlling, tuning, optimizing, and/or the like the frequency/wavelength of the induced signal or beam. For example, the frequency of the induced signal may be modified and/or adjusted from the frequency of the incoming manipulation signal to a frequency required for performing the desired interaction. For example, the signal manipulation element may be used to perform selective frequency up-conversion and/or down-conversion. In an example embodiment, the dynamically controllable optical effects of the signal manipulation element effecting the frequency of the induced signal or beam with respect to the frequency of incident signal or beam is controlled through the time-variant nonlinear response of material of the signal manipulation element to a controlling signal (e.g., a controlling electrical signal generated by a voltage source 50).

In various embodiments, the state of the dynamically controllable optical effects of a signal manipulation element may be used to control one or more reconfigurable effects of the induced signal or beam. For example, the state of the dynamically controllable optical effects of a signal manipulation element is used to perform beam steering and/or beam switching in various embodiments. For example, a single signal manipulation element is used to address multiple particle positions, in an example embodiment. For example, based on the state of the dynamically controllable optical effects of a signal manipulation element, the signal manipulation element is configured to provide an induced signal to one or more of a plurality of particle positions corresponding to the signal manipulation element. In an example embodiment, such a signal manipulation element 420 is formed and/or disposed on the second substrate 405 and configured to provide the induced signal(s) to corresponding particle positions 250 or to signal manipulation elements 220 formed and/or disposed on the first substrate 205. For example, a first signal manipulation element 420 may distribute a manipulation signal to second signal manipulation elements 220 that modulate various properties of the manipulation signal and provide the modulated manipulation signal to respective particle positions 250. In an example embodiment, beam steering is used to optimize beam alignment such that an induced signal is aligned with an appropriate portion of a particle position 250. For example, beam steering is used to compensate and/or adjust for fabrication and/or design errors in alignment. In an example embodiment, beam steering is used to select whether or not a particular manipulation signal is provided to a particular particle position.

In various embodiments, the state of the dynamically controllable optical effects of a signal manipulation element may be used to control an angle at which the induced signal and/or beam propagates. For example, the angle at which an induced signal propagates is controlled through the use of an encapsulant having a tunable, controllable, and/or dynamically configurable refractive index. For example, a waveguide or manipulation source may be disposed below the surface 208 of the first substrate 205 and the waveguide or manipulation source may be configured to provide a manipulation signal to a particle position with off-normal incidence. A signal manipulation element having a tunable, controllable, and/or dynamically configurable refractive index may be used to steer the manipulation signal toward the appropriate particle position. The tunable, controllable, and/or dynamically configurable refractive index of the signal manipulation element may further be used to fine-tune and/or optimize the particle interaction, compensate for fabrication, design, and/or alignment errors, and/or the like.

In various embodiments, the state of the dynamically controllable optical effects of a signal manipulation element may be used to control and/or adjust the focal length and/or focal shape and/or beam profile of the induced signal or beam. In an example embodiment, the focal length, focal shape, and/or beam profile control is used to perform fine tuning of the interaction between the induced signal 265 and a particle 5 located the particle position 250, for example, to maximize the particle interaction, account for alignment and/or fabrication errors, and/or the like. In an example embodiment, the focal length, focal shape, and/or beam profile control is used to perform amplitude tuning by adjusting the intensity and/or power of the induced signal that intersects the particle's 5 absorption cross-section. In various embodiments, control over and/or the ability to adjust the focal length and/or focal shape and/or beam profile of the induced signal or beam reduces the optical power requirements of the incoming manipulation signal, providing additional technical and power consumption advantages.

In various embodiments, control over the state of the dynamically controllable optical effects of a signal manipulation element is used to generate a fully reconfigurable hologram projection of one or more manipulation signals. For example, a combination of beam steering and/or switching optical effects and adjustable focal lengths and/or focal shape and/or beam profile may be used to provide a fully reconfigurable hologram projection of one or more manipulation signals. For example, in an example embodiment, fully reconfigurable projection optics enable on initial manipulation signal (e.g., generated by a manipulation source 60) to address, be incident at, and/or control interactions at a plurality of particle positions 250 independently.

In various embodiments, the modulation effects and reconfigurable effects of beam steering/switching and adjustable focal length, focal shape, and/or beam profile are used to generate and/or provide signal management systems that enable the use of larger confinement assemblies and/or a larger number of particles in the system.

Figure 5:
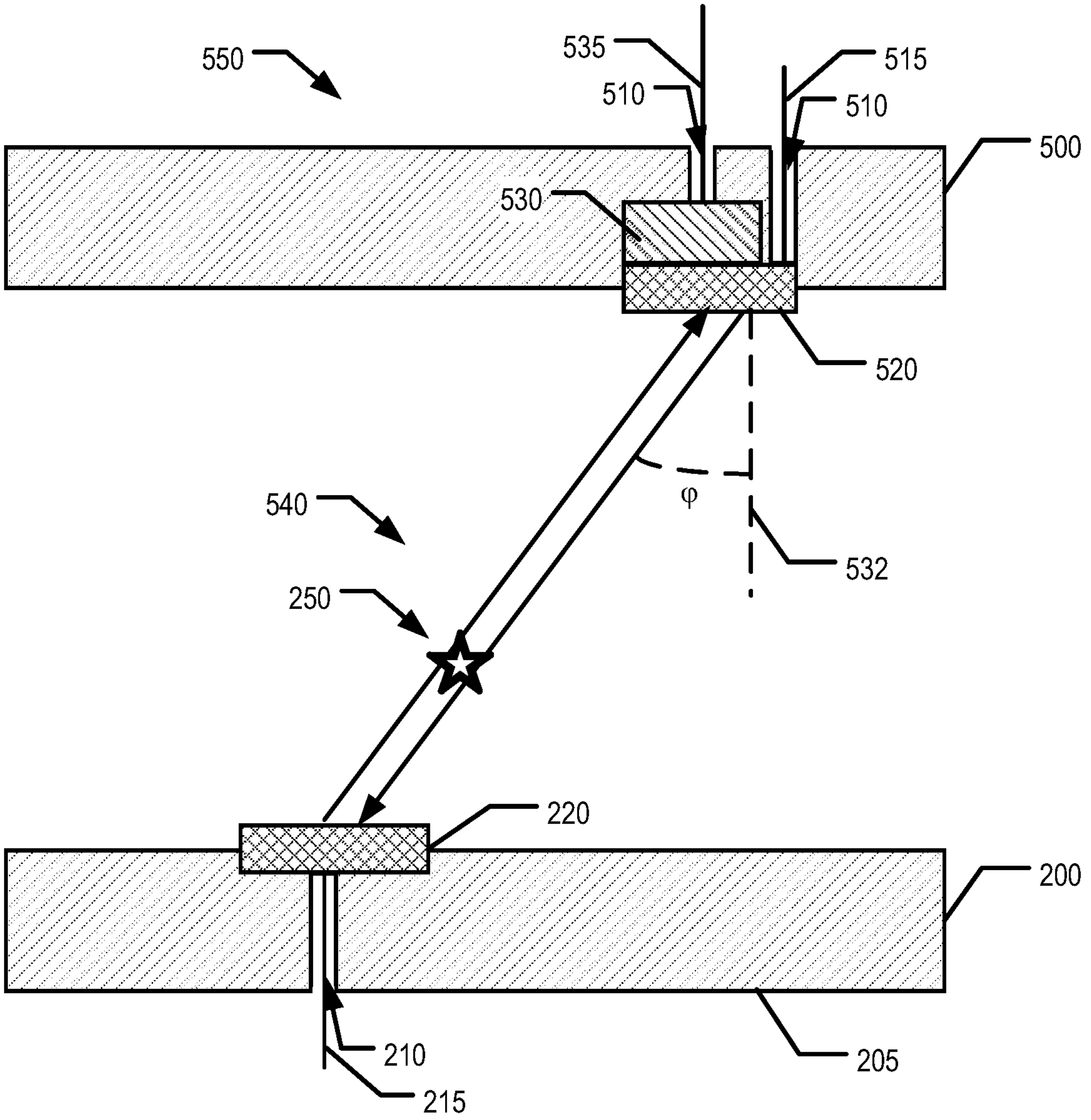
FIG. 5 is a schematic diagram of a portion of a confinement assembly where the source of the manipulation signal and/or beam is a vertical external cavity surface emitting laser (VECSEL) comprising a cavity defined at least in part by two signal manipulation elements, according to an example embodiment.

In various embodiments, one or more manipulation sources 60 are located within the cryostat and/or vacuum chamber 40. For example, in various embodiments, one or more manipulation sources are formed and/or disposed on the first substrate 205 (on which the confinement assembly is formed and/or disposed) or on the second substrate. FIG. 5 illustrates an example embodiment where a manipulation source 60 is a VECSEL 550 formed in part on and/or in a second substrate 500 and in part on the first substrate 205. FIG. 6 illustrates an example embodiment where a manipulation source 60 is a VCSEL 630 formed on or in the first substrate 205. In an example embodiment, a manipulation source 60 that is a VCSEL may be formed on and/or in the second substrate 405, 500. In various embodiments, the VECSEL 550 and/or VCSEL 630 comprise and/or are associated with one or more manipulation signal elements that comprise active nano-photonics having dynamically controllable optical effects.

In various embodiments, having a manipulation source 60 formed and/or disposed at least partially one the first substrate 205 (on which the confinement assembly 200 is formed and/or disposed) and/or on a second substrate that is mounted in a secured and/or controllable relationship with respect to the first substrate 205 simplifies the optical paths required to provide the manipulation signals to the particles 5. In various embodiments, having a manipulation source 60 formed and/or disposed at least partially one the first substrate 205 (on which the confinement assembly 200 is formed and/or disposed) and/or on a second substrate that is mounted in a secured and/or controllable relationship with respect to the first substrate 205 may also reduce the overall size of the quantum computer 110 and/or other trapped particle system by reducing the number of required manipulation sources 60 that are located exterior to the cryostat and/or vacuum chamber 40.

In various embodiments, a manipulation source 60 formed and/or disposed on the first substrate 205 and/or a second substrate that is mounted in a secured and/or controllable relationship with respect to the first substrate 205 comprises and/or is coupled to one or more signal manipulation elements.

In various embodiments, one or more signal manipulation elements are integrated into the manipulation source 60 as functional portions of the manipulation source itself. For example, FIG. 5 illustrates an example embodiment where the cavity 540 of a VECSEL 550 is defined at least in part by two signal manipulation elements 220, 520.

In various embodiments, a signal manipulation element is coupled to a manipulation source 60 such that one or more properties of a signal or beam generated by the manipulation source 60 are modified and/or controlled by the signal manipulation element (e.g., a state of the dynamically controllable optical effects of the signal manipulation element). For example, FIG. 6 illustrates an embodiment where a VCSEL 630 is formed one and/or in the first substrate and a signal manipulation element 220 is positioned over the emission aperture of the VCSEL 630 such that the signal and/or beam emitted by the VCSEL is modified, adjusted, and/or controlled by the signal manipulation element 220. For example, the signal manipulation element 220 may control the collimation, focusing, frequency, phase, pointing, and/or the like of the signal and/or beam emitted by the VCSEL 630. For example, the signal manipulation element 220 may be a metasurface lens coupled to the emission aperture of the VCSEL.

In general, a VCSEL comprises a first reflector, a second reflector, and an active region comprising multiple quantum well layers configured for generating light. The first reflector and the second reflector define the cavity of the VCSEL. In an example embodiment, one of the first reflector or the second reflector is a signal manipulation element configured to control when emission from the VCSEL is emitted (e.g., through controllable changes in the transmittance/reflectance of the signal manipulation element), the collimation and/or focusing of the emitted signal and/or beam, the direction of propagation of the emitted signal and/or beam, and/or the like.

FIG. 5 illustrates an example embodiment where a VECSEL 550 is formed and/or disposed at least partially within a second substrate 500 that is mounted in a secured and/or controllable manner with respect to the first substrate 205 on which the confinement assembly 200 is formed and/or disposed. The VECSEL comprises gain material 530. For example, the gain material may comprise a semiconductor material configured to generate light through recombination effects when a voltage differential is applied across the gain material. The VECSEL further comprises external cavity 540 that is defined at least in part by signal manipulation element 520, which is formed and/or disposed on and/or in the second substrate 500 proximate and/or adjacent the gain material 530. The external cavity 540 is also defined at least in part by signal manipulation element 220 formed and/or disposed on the first substrate 205.

In an example embodiment, voltage is applied to the gain material 530 via voltage control line 535 extending through a via 510 through at least a portion of the second substrate 500.

For example, the signal manipulation elements 520, 220 define an external cavity 540 using a photonic crystal or similar effect. In various embodiments, the frequency of the signal and/or beam provided by the VECSEL 550 is determined and/or controlled based on the frequency of light generated by the gain material 530 and the chromatic filtering performed by the external cavity 540 (e.g., a Fabry-Perot cavity).

In an example embodiment, injection locking and/or seeding is used to further control the frequency and the linewidth of the signal and/or beam provided by the VECSEL. In various embodiments, the frequency and/or narrow linewidth requirements of a function to be performed by the quantum computer 110 and/or other trapped particle system are strict and/or difficult to achieve using a physically small cavity. In such embodiments, an incident laser beam characterized by the desired frequency and/or narrow linewidth characteristics but at low power may be injected into and/or used to seed the external cavity 540. The incident laser beam used for the injection locking and/or seeding the external cavity 540 may be at substantially lower optical power than the optical power required for performance of the corresponding function. The seeding of the external cavity 540 may be used to cause the external cavity 540 and/or the VECSEL 550 to generate an optical signal and/or beam having the desired frequency and/or narrow linewidth characteristics.

Due to the direction control of the signal and/or beam provided through the use of the signal manipulation elements 520, 220 to define the external cavity 540 the external cavity 540 does not need to be aligned with the emission axis of the gain material 530. For example, as shown in FIG. 5, the external cavity 540 may be angled with respect to the direction of the voltage difference across the gain material 530. For example, the beam directing capabilities of the signal manipulation elements 220, 520 used to define the external cavity 540 enable the definition and/or formation of an angled external cavity. In an example embodiment, the gain material 530 is configured to emit light into the external cavity 540 at an angle that matches and/or aligns with the angle of the external cavity 540. For example, the surface normal 532 of the second substrate forms a non-zero angle $\varphi$ with the external cavity 540.

In various embodiments, as the external cavity 540 is angled with respect to the surface normal (e.g., the angle $\varphi$ is not equal to 0 or 180°), multiple VECSELs 550 may be associated with the particle position 250. For example, a plurality of external cavities 540, each corresponding to a VECSEL 550 formed at least in part on/in the first substrate 205 and at least in part on/in the second substrate 500, are formed so that the plurality of external cavities 540 intersect one another at the particle position, in an example embodiment. This enables the VECSELs 550 formed about the particle position 250 (e.g., with the particle position located within the corresponding angled external cavity 540) to be activated to perform different/distinct functions at the particle position 250 where the different/distinct functions have different frequency, polarization, and/or the like requirements.

In an example embodiment, a state of one of the signal manipulation elements 520, 220 is used to control when and how much (e.g., amplitude and/or power) of the signal and/or beam generated by the VECSEL 550 is directed toward the particle position 250 to be incident on one or more particles 5. For example, by changing a state of the dynamically controllable optical effects of the signal manipulation element 220, for example, a portion of the light within the external cavity could be directed toward the particle position 250.

In various embodiments, the states of the signal manipulation elements 520, 220 are controlled through control lines 515, 215, respectively. The control lines 515, 215 extend through the respective substrates through respective vias 510, 210. In an example embodiment, the first or second substrate 205, 500 may comprise one or more traces one a surface thereof and one or more of the voltage control line 535, control lines 515, 215 may be embodied, at least in part, as a trace on the surface of the respective substrate. For example, some embodiments do not include vias 210, 510.

In an example embodiment, the signal manipulation elements 220, 520 may also be used to control the polarization of light within the external cavity 540 and the polarization of a manipulation signal that is directed toward the particle position 250 from the external cavity 540.

Figure 6A:
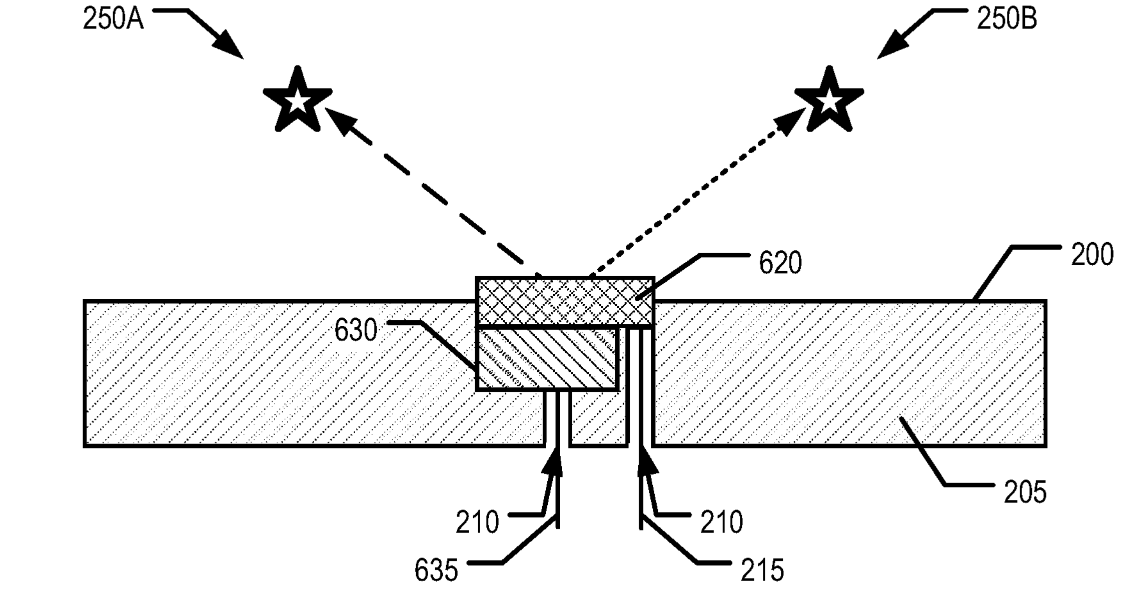
FIG. 6A is a schematic diagram of a portion of a confinement assembly where the source of the manipulation signal and/or beam is a vertical cavity surface emitting laser (VCSEL), according to an example embodiment.

FIG. 6A illustrates an example embodiment wherein a VCSEL 630 is formed within the first substrate 205. The VCSEL 630 is controlled through application of a voltage to the VCSEL 630 via the VCSEL control line 635 that extends at least partially through the first substrate 205 through via 210.

A signal manipulation element 620 is disposed and/or formed such that light exiting the emission aperture of the VCSEL 630 is incident on the signal manipulation element 620. The signal manipulation element 620 may therefore be used to control the direction of propagation; collimation and/or focusing; and/or phase, frequency, polarization and/or amplitude modulation of signals and/or beams emitted by the VCSEL 630.

For example, when the state of the dynamically controllable optical effects of the signal manipulation element 620 is a first state, a signal and/or beam emitted by the VCSEL 630 is directed toward the first particle position 250A as shown by the dashed line in FIG. 6. When the state of the dynamically controllable optical effects of the signal manipulation element 620 is a second state, a signal and/or beam emitted by the VCSEL 630 is directed toward the second particle position 250B as shown by the dotted line in FIG. 6A. Various other states of the dynamically controllable optical effects of the signal manipulation element 620 may be defined such that signals and/or beams may be provided to additional particle positions independently and/or to various combinations of particle positions. In various embodiments, the signal manipulation element 620 is also used to control the phase, polarization, and/or the like of the signal and/or beam provided to the first particle position 250A (e.g., in the first state), the second particle position 250B (e.g., in the second state), and/or other particle positions and/or combinations of particle positions.

Various other coherent light sources may be incorporated as at least a portion of a manipulation source 60 formed on the first substrate or the second substrate, in various embodiments. In various embodiments, the at last a portion of the manipulation source 60 formed on the first substrate or the second substrate includes a cavity or resonant structure configured such that the cavity or resonant structure is configured to confine a resonant or cavity mode of light within an array of nano-photonic structures. For example, an example manipulation source 60 according to an example embodiment includes an array of nano-photonic structures that circulate light within each individual nano-photonic structure of the array. As should be understood, a nano-photonic structure is a physical structure configured to interact and/or control optical beams/pulses and/or photons and that is characterized by at least one dimension having a scale comparable with or smaller than the wavelength of interacting light. For example, the nano-photonic structure may include a lattice or crystal structure that has nano-meter scale separation (e.g., a separation that is comparable with or smaller than the wavelength of the interacting light) between ions, atoms, and/or particles of the lattice or crystal. For example, ions, atoms, and/or particles of a lattice or crystal may be used along with Fano resonance(s) and/or quasi-bound states in the continuum, for example, to provide a high quality factor resonance.

Another example of a coherent light source that may be incorporated as at least a portion of a manipulation source 60 formed on the first substrate or a second substrate is a laser comprising a nano-photonic structure that defines a lateral cavity. For example, the lateral cavity may be a crystal or lattice formed by the array of nano-photonic structures. In various embodiments, the lateral cavity is a cavity or resonant structure formed by an array of nano-photonic structures that extend in a direction that is substantially parallel to a plane defined by a surface of the substrate (e.g., first substrate 205) on which the confinement assembly 200 is formed. In various embodiments, the nano-photonic structure is a photonic crystal cavity defined by a photonic crystal structure. An example of such a laser is a nanocrystal surface-emitting laser (NCSEL). In various embodiments, the laser comprising the lateral and/or photonic crystal cavity may be formed in the first substrate, similar to VCSEL 630, or in the second substrate, similar to the gain material 530 of the VECSEL 550. In an example embodiment, the lateral and/or photonic crystal cavity of the laser is transverse and/or orthogonal to the direction in which the manipulation signal is emitted (e.g., parallel to the surface of the first substrate 205 on which the confinement assembly 200 is formed).

In an example embodiment, the nano-photonic structure that defines the lateral cavity (e.g., the photonic crystal structure that defines the photonic crystal cavity) is configured to be and/or to have a surface that is a signal manipulation element. For example, the nano-photonic structure (e.g., the photonic crystal structure) comprises a metasurface, in an example embodiment. In an example embodiment, an emission surface of the nano-photonic structure (e.g., the surface of the nano-photonic structure through which the light is emitted) has a diffractive effect and/or comprises a metasurface (e.g., a metasurface lens). In various embodiments, the signal manipulation element that forms a portion (e.g., an emission surface) of the nano-photonic structure is configured to direct and/or control the outgoing emission (e.g., in terms of direction, focus, collimation, polarization, and/or the like). In an example embodiment, the nano-photonic structure also controls the mode of the emitted light.

In various embodiments, the lateral cavity (e.g., photonic crystal cavity) is injection locked and/or seeded to control the frequency, the linewidth, and/or the polarization of the signal and/or beam emitted from the lateral cavity. In various embodiments, the frequency, narrow linewidth, and/or polarization requirements of a function to be performed by the quantum computer 110 and/or other trapped particle system are strict and/or difficult to achieve using a physically small cavity. In such embodiments, an incident laser beam characterized by the desired frequency, narrow linewidth, and/or polarization characteristics but at low power may be injected into and/or used to seed the lateral cavity. The incident laser beam used for the injection locking and/or seeding the lateral cavity may be at substantially lower optical power than the optical power required for performance of the corresponding function. The seeding of the lateral cavity may be used to cause the lateral cavity and/or the laser comprising the lateral cavity to generate an optical signal and/or beam having the desired frequency, narrow linewidth, and/or polarization characteristics.

Figure 6B:
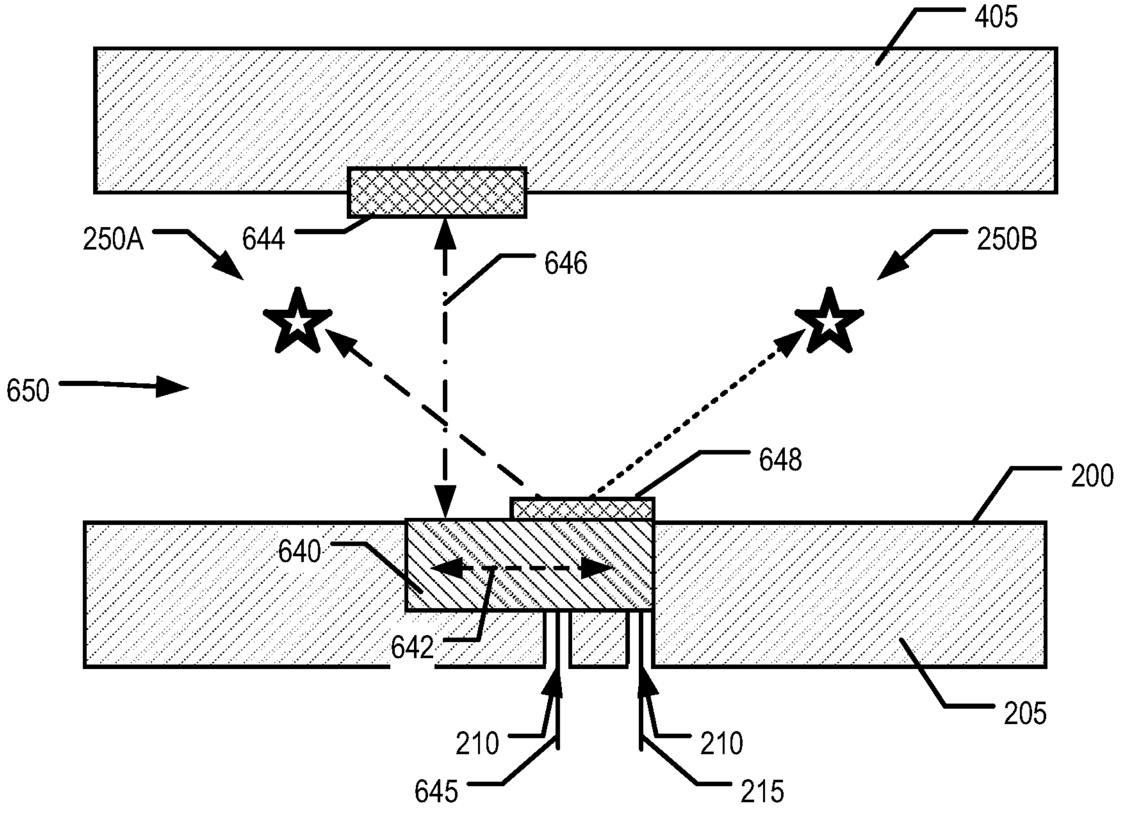
FIG. 6B is a schematic diagram of a portion of a confinement assembly where the source of the manipulation signal and/or beam is a laser having a lateral cavity, according to an example embodiment.

For example, FIG. 6B illustrates an manipulation source 60 formed on the first substrate 205 (and in part on the second substrate 405) that is a laser 650 comprising a nano-photonic structure 640 (e.g., a photonic crystal) that defines a lateral cavity (e.g., photonic crystal cavity). For example, the lateral cavity of the laser is transverse and/or orthogonal to the direction in which the manipulation signal is emitted (e.g., parallel to the surface of the first substrate 205 on which the confinement assembly 200 is formed) as shown by arrow 642. In the illustrated embodiment, the lateral cavity of the nano-photonic structure 640 is seeded by seed photons provided by an external cavity 646. In the illustrated embodiment, the external cavity 646 is defined, at least in part, by a signal manipulation element and/or retroreflector 644 disposed on the second substrate 405. For example, a portion (e.g., less than 50%) of the power generated by the laser 650 is provided to the external cavity 646 which is larger than the lateral cavity defined by the nano-photonic structure 640. Thus, the external cavity 646 may be configured for generating a (low-power compared to the output of the laser 650) beam and/or pulses that are then used to seed the lateral cavity defined by the nano-photonic structure 640. For example, the external cavity 646 is configured to generate (low-power compared to the output of the laser 650) beam and/or pulses that can be used to control the frequency, the linewidth, and/or the polarization of the signal and/or beam emitted from the lateral cavity defined by the nano-photonic structure 640.

In various embodiments, the laser 650 is controlled through application of a voltage to the laser 650 via the laser control line 645 that extends at least partially through the first substrate 205 through via 210. A signal manipulation element 620 is disposed and/or formed such that light exiting the emission aperture of the lateral cavity defined by the nano-photonic structure 640 (e.g., from the emission aperture of the photonic crystal cavity defined by the photonic crystal embodying the nano-photonic structure 640) is incident on the signal manipulation element 648. The signal manipulation element 648 may therefore be used, in an example embodiment, to control the direction of propagation; collimation and/or focusing; and/or phase, frequency, polarization and/or amplitude modulation of signals and/or beams emitted by the laser. In various embodiments, the signal manipulation element is a passive diffractive element (e.g., a lens or lens assembly), a passive or active nano-photonic element, and/or the like.

In various embodiments, various other forms of manipulation sources 60 may be formed and/or disposed on the first substrate 205 and/or a second substrate mounted in a secured and/or controllable relationship with the first substrate 205. In an example embodiment, at least one manipulation signal formed and/or disposed on the first substrate 205 and/or a second substrate mounted in a secured and/or controllable relationship with the first substrate 205 is an incoherent manipulation source. For example, the incoherent manipulation source is configured to emit, generate, and/or provide incoherent light.

In an example embodiment, an incoherent manipulation source comprises a signal manipulation element comprising an integrated fluorescent material. A photonic crystal effect of the signal manipulation element may be used to direct and/or focus light generated through fluorescence of the fluorescent material toward one or more particle positions. In an example embodiment, the signal manipulation element is further configured to control the polarization of light generated through fluorescence of the fluorescent material and directed toward the one or more particle positions.

In an example embodiment, the fluorescent material is integrated directly into a metasurface of a signal manipulation element. For example, the fluorescent material may be quantum dots or another emitting medium fabricated into the structures that form the metasurface. In another example embodiment, the fluorescent material is indirectly integrated into the metasurface of a signal manipulation element. For example, the metasurface may be formed on fluorescent film In an example embodiment, the incoherent manipulation source comprises one or more light emitting diodes (LEDs). A signal manipulation element may be used to direct and/or focus light generated by the LED(s) toward one or more particle positions. In an example embodiment, the signal manipulation element is further configured to control the polarization of light generated by the LED(s) and directed toward the one or more particle positions.

In an example embodiment, the manipulation signal generated by the incoherent manipulation source is used to perform photoionization of particles being loaded into the confinement assembly. For example, when the confinement assembly 200 is an ion trap, neutral atoms may be loaded into the ion trap and then photoionized to generate the trapped ions that are used as the particles of the system.

As noted above, a signal manipulation element may be used to perform frequency modulation of a signal and/or beam. In various embodiments, a signal manipulation element is used to perform frequency conversion of a signal and/or beam. Such frequency conversion effects may be combined with focusing and/or directing and/or pointing of the frequency converted signal and/or beam.

For example, in various embodiments, a signal manipulation element is configured to generate a second harmonic or a higher harmonic of an incident beam and/or signal. For example, the frequency of an induced beam may be characterized by and/or a frequency profile of the induced may comprise the second harmonic or a higher harmonic of the incident beam or signal.

In various embodiments, the frequency conversion performed by a signal manipulation element of the incident beam and/or signal is time variant. For example, the signal manipulation element may comprise a time-variant metasurface configured to modify the frequency of the induced signal and/or beam as a physical parameter of the metasurface changes quickly relative to the interaction time of the incident signal and/or beam with the signal manipulation element. The interaction time of the incident signal and/or beam interacting with the signal manipulation element is extended, in an example embodiment, through the use of high-Q (e.g., underdamped and/or low loss) resonances. For example, the physical parameter of the metasurface may be the refractive index of the metasurface, the effective phase response of the metasurface, and/or the like.

In various embodiments, performance of different/distinct functions of the quantum computer 110 and/or other trapped particle system require signals and/or beams of different frequencies. Conventionally, these different frequencies are generated by different manipulation sources 60 and provided along corresponding optical paths to the respective particle positions 250. In various embodiments, signal manipulation elements are used to convert an incident beam or signal (e.g., generated by a manipulation source 60) into induced signals and/or beams of a selected frequency, where the selected frequency is controlled by the state of the dynamically controllable optical effects of the signal manipulation signal.

For example, an signal or beam characterized by a particular frequency may be incident on the signal manipulation element. The resulting induced signal or beam is characterized by a first frequency when the state of the dynamically controllable optical effects is a first state and the resulting induced signal or beam is characterized by a second frequency when the state of the dynamically controllable optical effects is a second state. The first frequency is different from the second frequency and may or may not be different from the particular frequency of the incident signal or beam.

In an example embodiment, time-variant conversion effects are used and/or controlled to enable one or more signal manipulation elements to control the frequency of an induced signal and/or beam provided to one or more particle positions. For example, an incident signal or beam having a particular frequency being incident on a signal manipulation element may result in an induced signal of a selected frequency being provided to the particle position(s), where the selected frequency is selected, controlled, and/or determined based on the state of the dynamically controllable optical effects of the signal manipulation element.

In an example embodiment, a manipulation source 60 is configured to provide manipulation signals having an infrared, near infrared, or visible wavelength. When such a manipulation signal is incident on a signal manipulation element, the signal manipulation element is induced to emit an induced signal characterized by a selected wavelength that is shorter than the wavelength of the provided manipulation signal (e.g., visible and/or UV). For example, the manipulation source 60 is configured to generate a manipulation signal that is off-resonant and/or far-off resonant for various particle interactions of the trapped particles of the quantum computer 110 and/or other trapped particle system. In other words, the manipulation source 60 is configured to generate a manipulation signal that does not interact with the particles or only weakly interacts with the particles of the quantum computer 110 and/or other trapped particle system. The signal manipulation element(s) of the confinement assembly may then be used to convert the frequency of the manipulation signal to a selected frequency corresponding to a desired function of the quantum computer 110 and/or trapped particle system such that the resulting induced signal and/or beam causes and/or mediate the desired function and/or interaction. In various embodiments, providing manipulation signals to the signal manipulation elements that are configured to not interact and/or to weakly interact with the particles of the quantum computer 110 and/or other trapped particle system, crosstalk between various particle positions (e.g., due to light scattered from the surface 208, 408, and/or from input optics) is reduced.

The use of longer wavelength (e.g., infrared, near infrared, visible) manipulation signals that are up converted to induced signals of selected wavelengths by signal manipulation elements enables the portions of the optical paths that provide the manipulation signals to the signal manipulation elements to be configured to carry longer wavelength signals. For example, integrated waveguide photonics configured for use with infrared wavelengths are easier to design and fabricate, tend to have longer usable lifetimes, and tend to be easier to align and maintain alignment compared to waveguide photonics configured for use with shorter wavelengths (e.g., visible and/or UV wavelengths). Thus, performing frequency conversion at the signal manipulation elements provides various technical advantages, in various embodiments.

In various embodiments, the manipulation sources 60 comprise pulsed lasers. For example, a manipulation source 60 comprising a pulsed laser is configured to provide a pulsed signal and/or beam to a signal manipulation element configured to perform harmonic generation frequency conversion, in an example embodiment. The resulting incident signal and/or beam is a pulsed signal and/or beam having a shorter wavelength than the manipulation signal generated by the manipulation source 60, in an example embodiment.

In an example embodiment, a pulsed incident signal and/or beam may be used to perform a reading function. For example, to determine the quantum state of a particle, a reading beam may be caused to be incident on the particle to determine whether the particle is in a first state such that the particle fluoresces in response to the reading beam being incident thereon or in a second state such that the particle does not fluoresce in response to the reading beam being incident thereon. In an example embodiment, as the reading beam is a pulsed signal or beam, the photodetector configured to capture and/or detect the emitted, stimulated, and/or collection signal is gated with a delay to eliminate noise generated by scattering of light from the reading beam (or other signals and/or beams). For example, the photodetector may only be able to receive and/or detect light when the emitted, stimulated, and/or collection signal is expected to be present at the aperture of the photodetector. For example, the pulse reading beam may be used to provide background free, gated detection of particle fluorescence.

In an example embodiment, a pulsed incident signal and/or beam may be used to perform a single qubit gate or a two qubit gate. In an example embodiment, the repetition and/or pulse rate of the pulsed incident signal and/or beam is configured and/or locked to be commensurate and/or substantially equal to the hyperfine splitting of the particle's energy levels. This enables, in an example embodiment, a single qubit gate to be driven with one manipulation source 60 (rather than the two manipulation sources conventionally required). In an example embodiment, the repetition and/or pulse rate of the pulsed incident signal and/or beam is configured and/or locked to be commensurate and/or substantially equal to the axial or radial mode frequency of a particle crystal. The resulting pulsed induced signal and/or beam may then be used to perform a two qubit gate. In an example embodiment, the resulting pulsed induced signal is applied to the particle position at which the particle crystal is located at least semi-simultaneously with a second induced signal to cause performance of an entangling gate configured to entangle the quantum states of at least two particles of the particle crystal.

As described above, in an example embodiment, a signal manipulation element is configured to have at least a portion of an emitted and/or stimulated signal incident thereon and provide an induced collection signal to a collection location corresponding to the respective particle position to enable and/or cause detection of the emitted and/or stimulated signal. In an example embodiment, a signal manipulation element (e.g., a collection element) comprises a photoactive material. For example, the signal manipulation element is configured to absorb the portion of the emitted and/or stimulated signal incident thereon and generate an electrical signal indicative of the intensity of the portion of the emitted and/or stimulated signal incident on the signal manipulation element. The electrical signal may then be provided to the controller 30 (e.g., via A/D converter 1425, and/or the like).

In an example embodiment, a signal manipulation element comprising photoactive material is used to perform one or more system checks, calibration processes, alignment checks, and/or the like. For example, a signal manipulation element comprising photoactive material may be used to perform waveguide loss monitoring, alignment monitoring, and/or the like.

In an example embodiment, a signal manipulation element is used to perform signal and/or beam detection, optical loss monitoring, and/or alignment monitoring by collecting light and focusing the light directly onto an integrated photodetector detector or to couple the light into an optical fiber or other waveguide for routing to a photodetector. In an example embodiment, the signal manipulation element is configured to perform chromatic filtering of the light provided to the photodetector and/or coupled into the optical fiber or other waveguide. For example, the signal manipulation element may be configured to operate in a band-pass or band-block mode. In an example embodiment, the signal manipulation element may be configured to enable dynamic control of whether the signal manipulation element is operating in a band-pass or a band-block mode. In various embodiments, the optical coupling between the signal manipulation element and the photodetector or optical fiber or other waveguide is far-field or near-field.

Example Seeding and Optical Pumping of Integrated Lasers

In various embodiments, a confinement assembly comprises a first substrate 205 having a plurality of potential generating elements (e.g., electrodes) formed thereon. The potential generating elements are operable and/or configured for generating one or more confinement regions that are configured for confining one or more quantum objects. For example, when appropriate voltage signals are applied to the potential generating elements (e.g., electrodes), in an example embodiment, the potential generating elements generate one or more confining regions configured for confining one or more quantum objects. In various embodiments, the quantum objects are neutral or ionic atoms (e.g., ions); neutral, ionic, or multipolar molecules; quantum particles; groups or crystals of atoms or ions; and/or the like. In an example embodiment, the confinement assembly includes an ion trap such as a surface ion trap formed and/or at least partially defined by the potential generating elements formed on the first substrate 205

In various embodiments, the confinement assembly further comprises a second substrate 405 mounted in a secured relationship with the first substrate 205. For example, in various embodiments, the first substrate 205 and the second substrate 405 are secured and/or mounted to one another. In various embodiments, the second substrate 405 is mounted and/or secured in relationship to the first substrate 205 such that a surface of the first substrate 205 is substantially parallel to a corresponding surface of the second substrate 405. For example, a plane 480 defined by a surface of the second substrate 405 is parallel to a plane 280 defined by a corresponding surface of the first substrate 205. In various embodiments, the corresponding surfaces of the first substrate 205 and the second substrate 405 face one another and/or are directed toward one another.

In various embodiments, one or more lasers, or at least portions thereof, are formed on and/or in the first substrate 205 and/or the second substrate 405. For example, the respective gain media and at least a portion of a resonant structure and/or cavity (referred to herein as the resonant structure) of the one or more lasers are formed on and/or in the first substrate 205 and/or the second substrate 405. The one or more lasers are said to be integrated with the confinement assembly as they are formed and/or disposed, at least in part, on and/or in the first substrate 205 or the second substrate 405.

In various embodiments, the resonant structures of the integrated lasers are nano-photonic structures. Such resonant structures may be too small and/or have too small of a quality factor (e.g., Q factor) to be able to control the wavelength/frequency, line width, polarization, and/or optical mode emitted by the corresponding laser within the tolerances permitted by the application (e.g., interacting with confined quantum objects and/or trapped particles). Various embodiments provide a technical solution to this technical problem through the use of laser seeding. For example, in various embodiments, at least one of the one or more integrated lasers is configured to be seeded. For example, at least one of the one or more integrated lasers is configured to have a seeding laser beam interact with the gain media and/or resonant structure thereof. For example, the seeding laser beam is configured to control at least one property of light emitted by the integrated laser, such as the wavelength/frequency, line width, polarization, and/or optical mode emitted by the laser that the seeding laser beam interacts with the gain media and/or resonant structure thereof.

For a laser to lase, power must be supplied thereto. The gain media of the laser then converts the supplied power, or at least a portion thereof, into a laser beam or pulses emitted by the laser. To power an integrated laser, the power must be delivered to the gain media disposed on/in the first substrate and/or the second substate within the cryostat and/or vacuum chamber 40. In various embodiments, an electrical lead is used to provide an electrical pumping signal of sufficient power to the interior of the cryostat and/or vacuum chamber 40. However, a considerable number of leads may be required to provide voltage signals to the potential generating elements and/or signal manipulation elements 220 of the confinement assembly 200. Additionally, the lead configured to provide the electrical pumping signal to the integrated laser will need to be able to transmit high power electrical signals and withstand the heating caused by transmission of such high power electrical signals. In various embodiments, these technical challenges are overcome by optically pumping one or more integrated lasers of the confinement assembly.

For example, in various embodiments, at least one of the integrated lasers is configured to be optically pumped. For example, the lasing activity of the at least one integrated laser is powered by an optical pumping beam. In various embodiments, an optical pumping beam is an optical beam that is configured to excite the gain media of an integrated laser to power and/or cause the integrated laser to emit a respective laser beam (e.g., a manipulation signal). In various embodiments, the optical pumping of an integrated laser prevents the need for an electrical lead (e.g., provided from outside the cryostat and/or vacuum chamber 40 to the interior or of the cryostat and/or vacuum chamber 40) dedicated to electrically pumping the integrated laser. In various embodiments, the optical pumping beam is a laser beam. In an example embodiment, the optical pumping is a high power (e.g., sufficiently powerful to power the lasing of the integrated laser) optical beam that is not a laser beam (e.g., an optical beam that need not be monochromatic and/or coherent).

In various embodiments, the confinement assembly at least partially defines an optical path for causing a seeding laser beam to be incident on at least a portion of an integrated laser (e.g., the gain media and/or the resonant structure). In various embodiments, the confinement assembly at least partially defines an optical path for causing an optical pumping beam to be incident on the gain media of an integrated laser.

Figure 7:
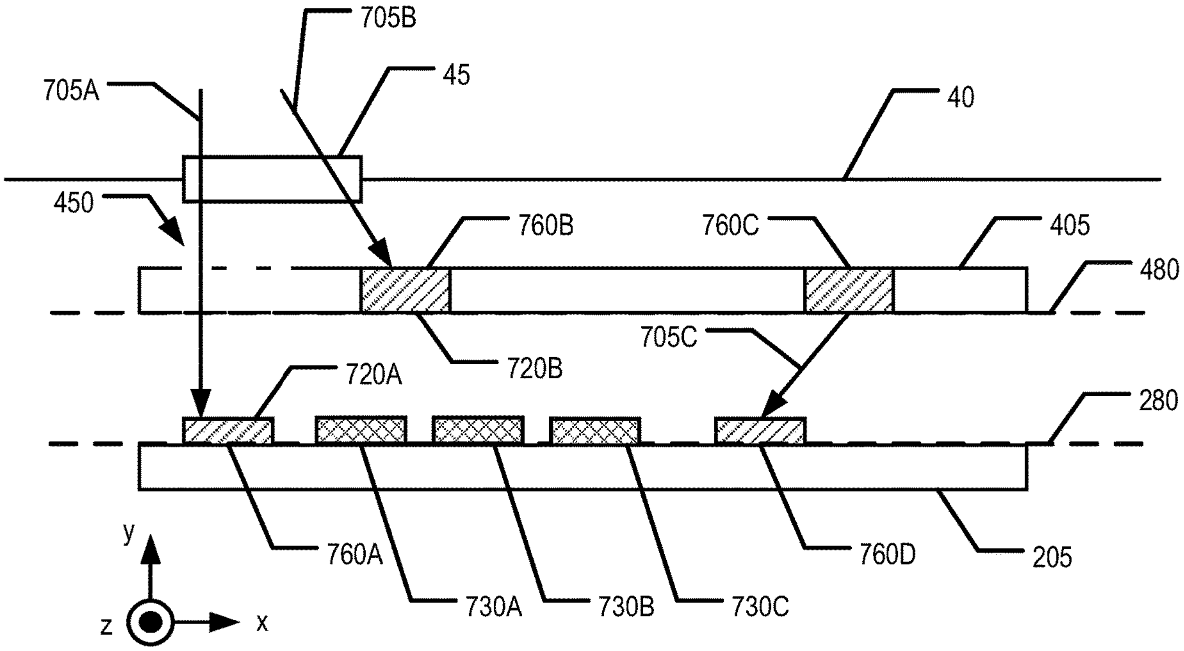
FIG. 7 is a schematic diagram of a portion of a confinement assembly having a plurality of integrated lasers that are seeded and/or optically pumped by respective laser beams received via optical paths that are, at least in part, free space optical paths defined at least in part by the confinement assembly, according to an example embodiment.

In various embodiments, an optical path defined at least in part by the confinement assembly comprises a free space optical path, as illustrated in FIG. 7. FIG. 7 illustrates integrated lasers 760A, 760D formed and/or disposed on the first substrate 205 on which the potential generating elements 730 (e.g., 730A, 730B, 730C; electrodes) are formed. Integrated lasers 760B, 760C are formed and/or disposed on and/or in the second substrate 405 that is mounted to and/or secured with respect to the first substrate 205. A first seeding laser beam and/or optical pumping beam 705A is incident on the first integrated laser 760A (e.g., the gain media and/or resonant structure thereof). The first seeding laser beam and/or optical pumping beam 705A is generated by a manipulation source 60 disposed outside of the cryostat and/or vacuum chamber 40 and is transmitted through an optical access window 45 of the cryostat and/or vacuum chamber 40. In the illustrated embodiment, the first seeding laser beam and/or optical pumping beam 705A is transmitted through a through hole 450 or transparent portion of the second substrate 405. In an example embodiment, the optical path along which the first seeding laser beam and/or optical pumping beam 705A is provided includes one or more free space optical elements (e.g., bulk optics). For example, the optical access window 45 may include a lenslet array and the first seeding laser beam and/or optical pumping beam 705A may be transmitted through a respective lenslet of the lenslet array. In another example, a lens, diffractive element, metasurface, and/or the like may be disposed along the optical path (e.g., in the through hole 450 and/or the like).

A second seeding laser beam and/or optical pumping beam 705B is incident on the second integrated laser 760B (e.g., the gain media and/or resonant structure thereof). The second seeding laser beam and/or optical pumping beam 705B is generated by a manipulation source 60 disposed outside of the cryostat and/or vacuum chamber 40 and is transmitted through an optical access window 45 of the cryostat and/or vacuum chamber 40. In an example embodiment, the optical path along which the second seeding laser beam and/or optical pumping beam 705B is provided includes one or more free space optical elements (e.g., bulk optics). For example, the optical access window 45 may include a lenslet array and the second seeding laser beam and/or optical pumping beam 705B may be transmitted through a respective lenslet of the lenslet array. In another example, a lens, diffractive element, metasurface, and/or the like may be disposed along the optical path between the optical access window 45 and the second integrated laser 760B.

In the illustrated embodiment, the third seedling laser beam and/or optical pumping beam 705C is generated by a third integrated laser 760C and is incident on a fourth integrated laser 760D (e.g., the gain media and/or resonant structure thereof). For example, the confinement assembly may include one or more integrated lasers that are configured for the purpose of providing seeding laser beams and/or optical pumping beams to one or more other integrated lasers. For example a portion of the laser power emitted by the third integrated laser 760C may be used to seed the fourth integrated laser 760D, in an example embodiment, while the remainder of the laser power emitted by the third integrated laser 760C is used as a manipulation signal to perform one or more quantum operations (ionize one or more quantum objects, initialize the quantum object(s) into a predetermined quantum state, initialize the quantum object(s) into a defined set of quantum states (e.g., a defined qubit space and/or the like), perform quantum gates (e.g., single qubit gates, two qubit gates, and/or the like) on the quantum object(s), perform reading operations to determine a quantum state of the quantum object (s), and/or the like) at one or more quantum object positions. In an example embodiment, all of the laser power emitted by the third integrated laser 760C is used to seed and/or optically pump the fourth integrated laser 760D and/or a plurality of integrated lasers.

In various embodiments, an integrated laser comprises a signal manipulation element 720 (e.g., 720A, 720B). For example, the integrated laser 760A is configured to emit a manipulation signal through a signal manipulation element 720A such that the manipulation signal emitted by the integrated laser 760A is conditioned by the signal manipulation element 720A, as described in detail elsewhere herein. For example, the signal manipulation element may be configured to control the beam position/angle (direction of propagation of the emitted signal/beam), focal length, polarization, phase, frequency, beam pattern, and power (e.g., amplitude), chromatic filtering, and/or the like of the manipulation signal emitted by the integrated laser 760 and/or provided to a respective quantum object position defined by the confinement assembly.

In the illustrated embodiment, the first seeding laser beam and/or optical pumping beam propagates in a direction that includes a component that is transverse (e.g., not parallel to) a plane 280 defined by the surface of the first substrate 205 on which the first integrated laser 760A is formed and/or disposed. For example, the confinement assembly 200 may at least partially define one or more optical paths for providing seeding laser beams and/or optical pumping beams that are transverse to (e.g., not parallel to) a plane 280 defined by the first substrate 205.

In various embodiments, the confinement assembly at least partially defines one or more optical paths for providing seeding laser beams and/or optical pumping beams that are parallel to the plane 280 defined by the first substrate 205 and/or the plane 480 defined by the second substrate 405. Various examples of such optical paths defined at least in part by the confinement assembly are illustrated in FIGS. 8-13.

Figure 8:
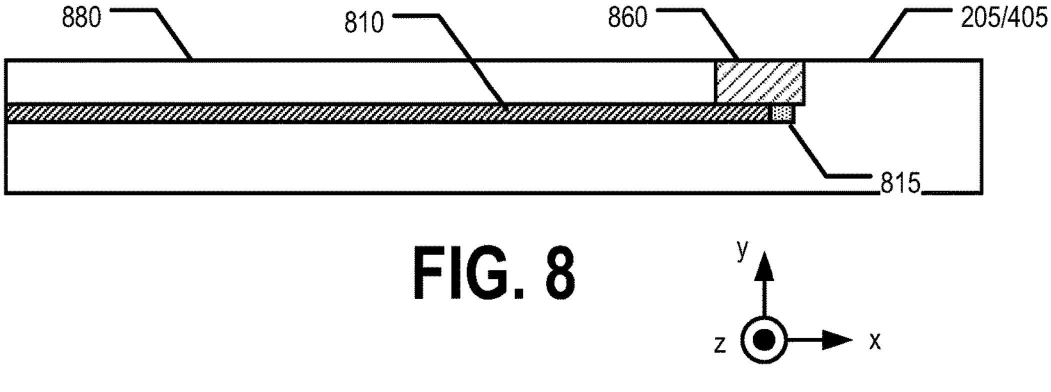
FIG. 8 is schematic diagram of a portion of a confinement assembly having an integrated laser that is seeded and/or optically pump via an optical path that includes a waveguide formed in the substrate and an out-of-plane coupler, according to an example embodiment.

FIG. 8 illustrates a portion of the first or second substrate 205/405 in an example embodiment where a waveguide 810 is disposed within the first or second substrate 205/405 and configured to provide a seeding laser beam and/or an optical pumping beam to an integrated laser 860. In the illustrated embodiment, the waveguide 810 is coupled to the integrated laser 860 via an out-of-plane coupler 815. For example, the waveguide 810 is displaced from the integrated laser 860 in the y-direction, as illustrated in FIG. 8. For example, the waveguide 810 is disposed further from the surface 880 of the first or second substrate 205/405 than the integrated laser 860. The out-of-plane coupler 815 is configured to couple a seeding laser beam and/or optical pumping beam propagating through the waveguide 810 out of the plane of the waveguide 810 and onto the integrated laser 860 such that the seeding laser beam and/or optical pumping beam is incident on the gain media and/or resonant structure of the integrated laser 860. In various embodiments, the out-of-plane coupler 815 is a grating coupler, metasurface coupler (e.g., a coupler comprising a metasurface and/or meta materials), and/or other optical coupler configured to couple light out of the plane of the waveguide 810. In various embodiments, the out-of-plane coupler 815 is configured to couple all of the seeding laser beam and/or optical pumping beam out of the waveguide 810 and to the integrated laser 860. In various embodiments, the out-of-plane coupler 815 is configured to couple a fraction f of the seeding laser beam and/or optical pumping beam out of the waveguide 810 and to the integrated laser 860, where $0<f<1$.

Figure 9:
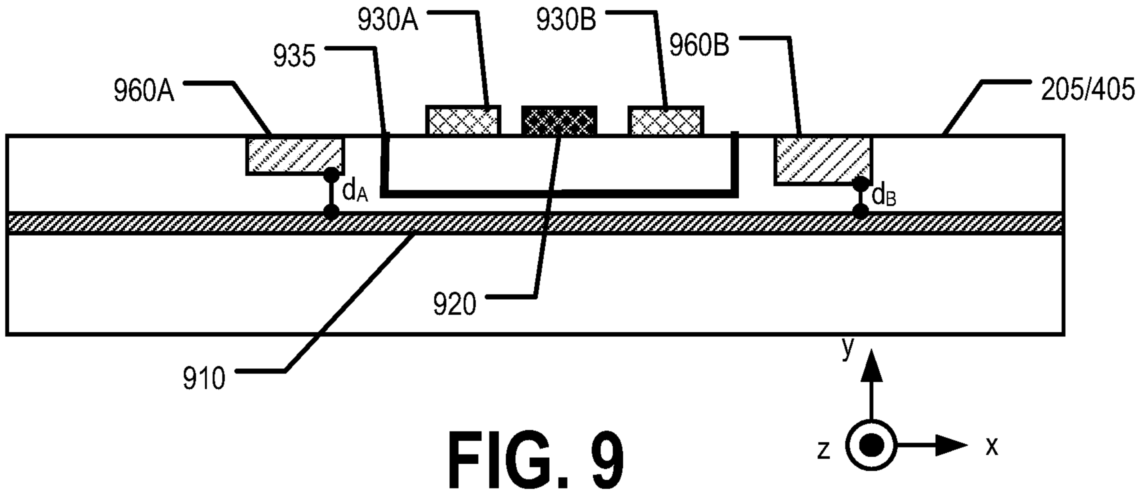
FIG. 9 is schematic diagram of a portion of a confinement assembly having integrated lasers that are seeded and/or optically pump via an evanescent coupling with a seeding laser beam or an optically pumping laser beam propagating through a waveguide formed in the substrate, according to an example embodiment.

FIG. 9 illustrates a portion of a first or second substrate 205/405 in an example embodiment where a waveguide 910 is configured to provide a seeding laser beam and/or optical pumping beam to integrated lasers 960A, 960B using evanescent coupling. Evanescent coupling between a waveguide and a target (e.g., the gain media and/or resonant structure of an integrated laser) when the waveguide is close enough to the target such that the evanescent field (e.g., near-field/non-propagating electro-magnetic field) generated by a seeding laser beam and/or optical pumping beam propagating through the waveguide physically overlaps the with the target. For example, the first integrated laser 960A is disposed a first distance $d_A$ from the waveguide 910 and the second integrated laser 960B is disposed a second distance $d_B$ from the waveguide 910. The first and second distances are configured such that when a seeding laser beam and/or optical pumping beam propagates through the waveguide 910, the evanescent field generated by the propagation of the seeding laser beam and/or optical pumping beam through the waveguide 910 is incident on and/or physically overlaps with the first and second integrated lasers 960A, 960B.

The strength of the coupling between the first and second integrated lasers 960A, 960B and a seeding laser beam and/or optical pumping beam propagating through the waveguide 910 is determined and/or controlled by the distance between the waveguide 910 and the respective integrated laser. For example, the first distance $d_A$ is larger than the second distance $d_B$. Thus, the strength of the coupling of the first integrated laser 960A to a seeding laser beam and/or optical pumping beam propagating through the waveguide 910 is less than the strength of the coupling of the second integrated laser 960B to a seeding laser beam and/or optical pumping beam propagating through the waveguide 910.

In various embodiments, in order to prevent seeding laser beams and/or optical pumping beams propagating through waveguides and/or oscillating electromagnetic fields within integrated lasers from evanescently coupling with the potential generating elements 930 (e.g., 930A, 930B) and/or signal manipulation elements 920 formed on the first and/or second substrate 205/405, the first and/or second substrate 205/405 may include one or more shields 935. In various embodiments, the one or more shields 935 are formed of an electrically conductive material and grounded so as to shield respective portions and/or areas of the first and/or second substrate 205/405 from electromagnetic fields within the substrate.

Figure 10:
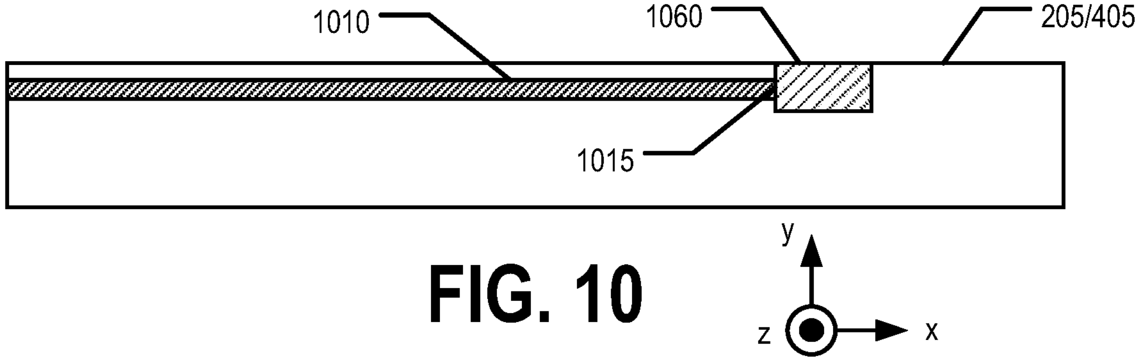
FIG. 10 is schematic diagram of a portion of a confinement assembly having an integrated laser that is seeded and/or optically pump via an optical path that includes a waveguide formed in the substrate and coupled to the integrated laser via an edge coupler, according to an example embodiment.

FIG. 10 illustrates a portion of a first or second substrate 205/405 comprising a waveguide 1010 configured to provide a seeding laser beam and/or optical pumping beam to an integrated laser 1060 via a direct coupling or edge coupling 1015. In an example embodiment, the direct coupling or edge coupling 1015 is a butt coupling where the waveguide 1010 terminates at the integrated laser 1060 (e.g., the gain media and/or resonant structure thereof). For example, the waveguide 1010 and the integrated laser 1060 may be formed at depths within the first or second substrate 205/405 such that the waveguide 1010 may be directly coupled (e.g., butt coupled) to the integrated laser 1060. In an example embodiment, the direct coupling or edge coupling 1015 includes a signal manipulation element (e.g., a diffractive optical element such as a lens, a metasurface lens, and/or the like).

In various embodiments, the waveguides 810, 910, 1010 are non-planer waveguides configured to provide two-dimensional transverse optical confinement. For example, in various embodiments, the waveguides 810, 910, 1010 provide optical confinement in both they and z directions, as illustrated in the respective figures. In various embodiments, the waveguides 810, 910, 1010 are planar or slab waveguides configured to provide optical confinement in one transverse direction. For example, in various embodiments, the waveguides 810, 910, 1010 provide optical confinement only in the y direction, as illustrated in the respective figures.

Figure 11:
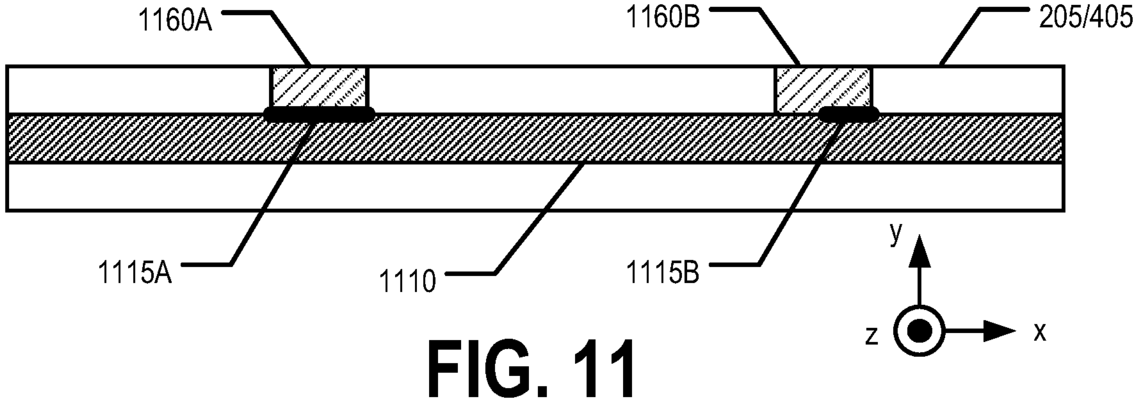
FIG. 11 is a schematic diagram of a portion of a confinement assembly having integrated lasers that are seeded and/or optically pumped via a slab waveguide and respective out-of-plane couplers, according of an example embodiment.

FIG. 11 illustrates a portion of a first or second substrate 205/405 comprising a planar or slab waveguide 1110 configured to provide seeding laser beams and/or optical coupling beams to a first integrated laser 1160A and a second integrated laser 1160B. The planar or slab waveguide 1110 is configured to have multiple seeding laser beams and/or optical coupling beams propagating therethrough with each seeding laser beam and/or optical coupling beam characterized by a different wavelength and/or different polarization. Each integrated laser 1160 (e.g., 1160A, 1160B) is coupled to the planar or slab waveguide 1110 via a respective out-of-plane coupler 1115 (e.g., 1115A, 1115B). The respective out-of-plane couplers 1115 are configured to be selectively resonant. For example, the first out-of-plane coupler 1115A is configured to only be resonant with optical signals of a first wavelength. Thus, the first out-of-plane coupler 1115A only couples the first integrated laser 1160A to seeding laser beams and/or optical pumping beams propagating through the planar or slab waveguide 1110 that are characterized by the first wavelength. The second out-of-plane coupler 1115B is configured to only be resonant with optical signals of a second wavelength. Thus, the second out-of-plane coupler 1115B only couples the second integrated laser 1160B to seeding laser beams and/or optical pumping beams propagating through the planar or slab waveguide 1110 that are characterized by the second wavelength. This allows for different seeding laser beams and/or optical pumping beams to be provided through the same waveguide while providing appropriate seeding laser beams and/or optical pumping beams to respective integrated lasers. In various embodiments, the out-of-plane couplers 1115 are grating couplers, metasurface couplers, and/or other out-of-plane couplers configured to be resonant with light of a particular wavelength or light having a particular polarization.

Figure 12:
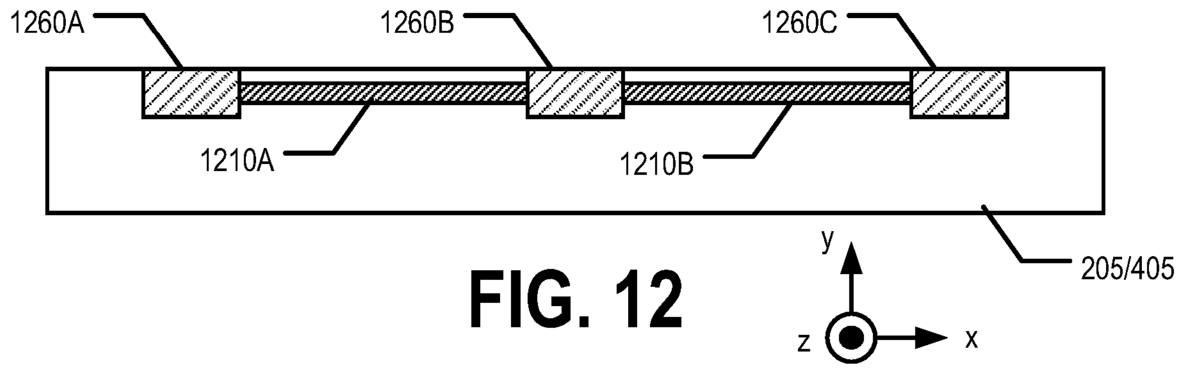
FIG. 12 is a schematic diagram of a portion of a confinement assembly having integrated lasers that are seeded and/or optically pumped using a daisy-chained re-seeding or re-pumping scheme, according to an example embodiment.

FIG. 12 illustrates a portion of a first or second substrate 205/405 where a plurality of integrated lasers 1260 (e.g., 1260A, 1260B, 1260C) are daisy-chained together using waveguides 1210 (e.g., 1210A, 1210B). The first integrated laser 1260A may be seeded by a seeding laser beam generated by a manipulation source 60 disposed outside of the cryostat and/or vacuum chamber 40. A portion of the laser beam emitted by the first integrated laser 1260A is provided as a seeding laser beam to the second integrated laser 1260B (e.g., via first waveguide 1210A). A portion of the laser beam emitted by the second integrated laser 1260B is provided as a seeding laser beam to the third integrated laser 1260C (e.g., via second waveguide 1210B). This enables multiple integrated lasers to be seeded using only one optical beam delivered from outside of the cryostat and/or vacuum chamber 40 such that the number of optical signals required to be delivered from outside of the cryostat and/or vacuum chamber 40 to the inside of the cryostat and/or vacuum chamber 40 need not scale linearly with the number of integrated lasers of the confinement assembly.

Figure 13:
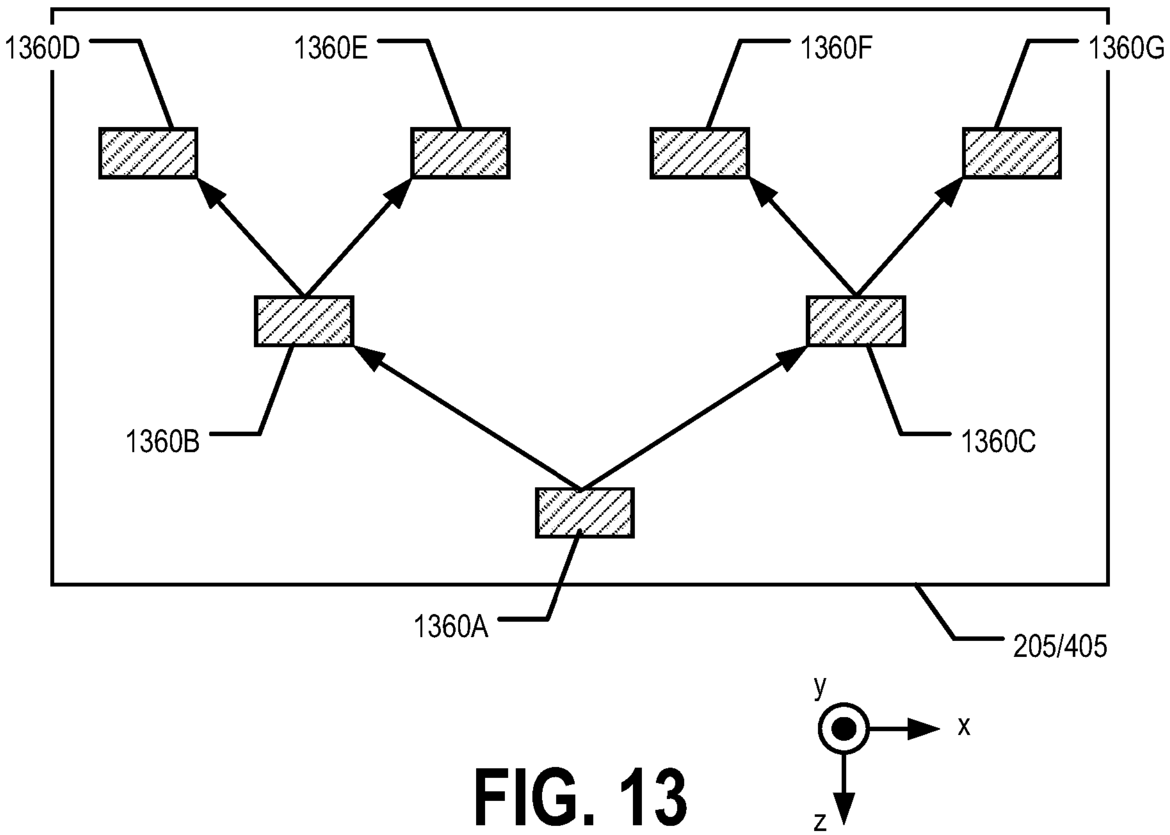
FIG. 13 is a schematic diagram of a portion of a confinement assembly having integrated lasers that are seeded and/or optically pumped using a cascading re-seeding or re-pumping scheme, according to an example embodiment.

FIG. 13 illustrates a portion of a first or second substrate 205/405 having a plurality of integrated lasers 1360 (e.g., 1360A, 1360B, 1360C, 1360D, 1360E, 1360F, 1360G) formed thereon/in. A first integrated laser 1360A may be seeded by a seeding laser beam generated by a manipulation source 60 disposed outside of the cryostat and/or vacuum chamber 40. At least a portion of the laser beam emitted by the first integrated laser 1360A is provided as seeding laser beams to the second integrated laser 1360B and the third integrated laser 1360C. For example, at least a portion of the laser beam emitted by the first integrated laser 1360A may be transmitted through a non-planar waveguide comprising a beam splitter and/or a slab waveguide such that the at least a portion of the laser beam emitted by the first integrated laser 1360A seeds the second and third integrated lasers 1360B, 1360C. In various embodiments, the at least a portion of the laser beam emitted by the first integrated laser 1360A used to seed other integrated lasers 1360 may be used to seed two or more (e.g., two, three, four, six, and/or the like) other integrated lasers formed on and/or in the first substrate 205 or the second substrate 405. At least a portion of the laser beam emitted by the second integrated laser 1360B is used to seed the fourth and fifth integrated lasers 1360D, 1360E and at least a portion of the laser beam emitted by the third integrated laser 1360C is used to seed the sixth and seventh integrated lasers 1360F, 1360G. This enables multiple integrated lasers to be seeded using only one optical beam delivered from outside of the cryostat and/or vacuum chamber 40 such that the number of optical signals required to be delivered from outside of the cryostat and/or vacuum chamber 40 to the inside of the cryostat and/or vacuum chamber 40 need not scale linearly with the number of integrated lasers of the confinement assembly. Moreover, the seeding laser beam provided to the seventh integrated laser 1360G is only two steps removed from the seeding laser beam provided to the first integrated laser 1360A. Therefore the properties of the seeding laser beam (e.g., wavelength/frequency, line width, polarization, and/or optical mode) provided to the seventh integrated laser 1360G have experienced fewer perturbations and/or are less influenced by noise than if the seeding laser beam provided to the seventh integrated laser 1360G were seven steps removed from the seeding laser beam provided to the first integrated laser 1360A As shown in FIG. 7, an integrated laser 760 formed on and/or in the second substrate 405 may be used to seed one or more integrated lasers 760 formed on and/or in the first substrate 205 and vice versa. In various embodiments, an integrated laser may be configured to provide a seeding laser beam to one or more other integrated lasers of the confinement assembly via one or more optical paths as illustrated in any of FIGS. 7-13 and/or a combination thereof.

In various embodiments, seeding laser beams are provided to one or more integrated lasers constantly during the operation of the confinement assembly. In various embodiments, seeding laser beams are selectively provided to one or more integrated lasers (e.g., when the integrated lasers are lasing or will be lasing within the next second or so). In embodiments where an integrated laser is pumped or powered using an optical pumping beam, the optical pumping beam is provided to the integrated laser to cause the integrated laser to lase. For example, the optical pumping beam is provided to an integrated laser so as to control when the integrated laser emits a respective laser beam.

Exemplary Controller

In various embodiments, a confinement assembly 200 is incorporated into a system (e.g., a quantum computer 110 or other trapped particle system) comprising a controller 30. In various embodiments, the controller 30 is configured to control various elements of the system (e.g., quantum computer 110 or other trapped particle system). For example, the controller 30 may be configured to control the state of the dynamically controllable optical properties of one or more signal manipulation elements 220, 420. For example, the controller 30 may be configured to control the voltage sources 50, a cryostat system and/or vacuum system controlling the temperature and pressure within the cryostat and/or vacuum chamber 40, manipulation sources 60, cooling system, and/or other systems controlling the environmental conditions (e.g., temperature, humidity, pressure, and/or the like) within the cryostat and/or vacuum chamber 40 and/or configured to manipulate and/or cause a controlled evolution of quantum states of one or more quantum objects confined by the confinement assembly 200. In various embodiments, the controller 30 may be configured to receive signals from one or more optics collection systems 70.

As shown in FIG. 14, in various embodiments, the controller 30 may comprise various controller elements including processing device 1405, memory 1410, driver controller elements 1415, a communication interface 1420, analog-digital converter elements 1425, and/or the like. For example, the processing device 1405 may comprise one or more processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. and/or controllers. The term circuitry may refer to an entirely hardware embodiment or a combination of hardware and computer program products. In an example embodiment, the processing device 1405 of the controller 30 comprises a clock and/or is in communication with a clock.

For example, the memory 1410 may comprise non-transitory memory such as volatile and/or non-volatile memory storage such as one or more of as hard disks, ROM, PROM, EPROM, EEPROM, flash memory, MMCs, SD memory cards, Memory Sticks, CBRAM, PRAM, FeRAM, RRAM, SONOS, racetrack memory, RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. In various embodiments, the memory 1410 may store a queue of commands to be executed to cause a quantum algorithm and/or circuit to be executed (e.g., an executable queue), qubit records corresponding the qubits of quantum computer (e.g., in a qubit record data store, qubit record database, qubit record table, and/or the like), a calibration table, computer program code (e.g., in a one or more computer languages, specialized controller language(s), and/or the like), and/or the like. In an example embodiment, execution of at least a portion of the computer program code stored in the memory 1410 (e.g., by a processing device 1405) causes the controller 30 to perform one or more steps, operations, processes, procedures and/or the like described herein for providing manipulation signals to quantum object positions and/or collecting, detecting, capturing, and/or measuring indications of emitted signals emitted by quantum objects located at corresponding quantum object positions of the confinement assembly 200.

In various embodiments, the driver controller elements 1415 may include one or more drivers and/or controller elements each configured to control one or more drivers. In various embodiments, the driver controller elements 1415 may comprise drivers and/or driver controllers. For example, the driver controllers may be configured to cause one or more corresponding drivers to be operated in accordance with executable instructions, commands, and/or the like scheduled and executed by the controller 30 (e.g., by the processing device 1405). In various embodiments, the driver controller elements 1415 may enable the controller 30 to operate a voltage sources 50, manipulation sources 60, cooling system, and/or the like. In various embodiments, the drivers may be laser drivers configured to operate one or manipulation sources 60 to generate manipulation signals; vacuum component drivers; drivers for controlling the flow of current and/or voltage applied to electrodes used for maintaining and/or controlling the trapping potential of the confinement assembly 200 (and/or other drivers for providing driver action sequences to potential generating elements of the quantum object confinement assembly); cryostat and/or vacuum system component drivers; cooling system drivers, and/or the like. In various embodiments, the controller 30 comprises means for communicating and/or receiving signals from one or more optical receiver components (e.g., photodetectors of the optics collection system). For example, the controller 30 may comprise one or more analog-digital converter elements 1425 configured to receive signals from one or more optical receiver components (e.g., a photodetector of the optics collection system), calibration sensors, and/or the like.

In various embodiments, the controller 30 may comprise a communication interface 1420 for interfacing and/or communicating with a computing entity 10. For example, the controller 30 may comprise a communication interface 1420 for receiving executable instructions, command sets, and/or the like from the computing entity 10 and providing output received from the quantum computer 110 (e.g., from an optics collection system 70) and/or the result of a processing the output to the computing entity 10. In various embodiments, the computing entity 10 and the controller 30 may communicate via a direct wired and/or wireless connection and/or via one or more wired and/or wireless networks 20.

Exemplary Computing Entity

FIG. 15 provides an illustrative schematic representative of an example computing entity 10 that can be used in conjunction with embodiments of the present invention. In various embodiments, a computing entity 10 is configured to allow a user to provide input to the quantum computer 110 (e.g., via a user interface of the computing entity 10) and receive, display, analyze, and/or the like output from the quantum computer 110.

As shown in FIG. 15, a computing entity 10 can include an antenna 1512, a transmitter 1504 (e.g., radio), a receiver 1506 (e.g., radio), and a processing device 1508 that provides signals to and receives signals from the transmitter 1504 and receiver 1506, respectively. The signals provided to and received from the transmitter 1504 and the receiver 1506, respectively, may include signaling information/data in accordance with an air interface standard of applicable wireless systems to communicate with various entities, such as a controller 30, other computing entities 10, and/or the like. In this regard, the computing entity 10 may be capable of operating with one or more air interface standards, communication protocols, modulation types, and access types. For example, the computing entity 10 may be configured to receive and/or provide communications using a wired data transmission protocol, such as fiber distributed data interface (FDDI), digital subscriber line (DSL), Ethernet, asynchronous transfer mode (ATM), frame relay, data over cable service interface specification (DOCSIS), or any other wired transmission protocol. Similarly, the computing entity 10 may be configured to communicate via wireless external communication networks using any of a variety of protocols, such as general packet radio service (GPRS), Universal Mobile Telecommunications System (UMTS), Code Division Multiple Access 2000 (CDMA2000), CDMA2000 1× (1×RTT), Wideband Code Division Multiple Access (WCDMA), Global System for Mobile Communications (GSM), Enhanced Data rates for GSM Evolution (EDGE), Time Division-Synchronous Code Division Multiple Access (TD-SCDMA), Long Term Evolution (LTE), Evolved Universal Terrestrial Radio Access Network (E-UTRAN), Evolution-Data Optimized (EVDO), High Speed Packet Access (HSPA), High-Speed Downlink Packet Access (HSDPA), IEEE 802.11 (Wi-Fi), Wi-Fi Direct, 802.16 (WiMAX), ultra-wideband (UWB), infrared (IR) protocols, near field communication (NFC) protocols, Wibree, Bluetooth protocols, wireless universal serial bus (USB) protocols, and/or any other wireless protocol. The computing entity 10 may use such protocols and standards to communicate using Border Gateway Protocol (BGP), Dynamic Host Configuration Protocol (DHCP), Domain Name System (DNS), File Transfer Protocol (FTP), Hypertext Transfer Protocol (HTTP), HTTP over TLS/SSL/Secure, Internet Message Access Protocol (IMAP), Network Time Protocol (NTP), Simple Mail Transfer Protocol (SMTP), Telnet, Transport Layer Security (TLS), Secure Sockets Layer (SSL), Internet Protocol (IP), Transmission Control Protocol (TCP), User Datagram Protocol (UDP), Datagram Congestion Control Protocol (DCCP), Stream Control Transmission Protocol (SCTP), HyperText Markup Language (HTML), and/or the like.

Via these communication standards and protocols, the computing entity 10 can communicate with various other entities using concepts such as Unstructured Supplementary Service information/data (USSD), Short Message Service (SMS), Multimedia Messaging Service (MMS), Dual-Tone Multi-Frequency Signaling (DTMF), and/or Subscriber Identity Module Dialer (SIM dialer). The computing entity 10 can also download changes, add-ons, and updates, for instance, to its firmware, software (e.g., including executable instructions, applications, program modules), and operating system.

For example, the processing device 1508 may comprise one or more processing elements such as programmable logic devices (CPLDs), microprocessors, coprocessing entities, application-specific instruction-set processors (ASIPs), integrated circuits, application specific integrated circuits (ASICs), field programmable gate arrays (FPGAs), programmable logic arrays (PLAs), hardware accelerators, other processing devices and/or circuitry, and/or the like. and/or controllers. The term circuitry may refer to an entirely hardware embodiment or a combination of hardware and computer program products.

In various embodiments, the computing entity 10 may comprise a network interface 1520 for interfacing and/or communicating with the controller 30, for example. For example, the computing entity 10 may comprise a network interface 1520 for providing executable instructions, command sets, and/or the like for receipt by the controller 30 and/or receiving output and/or the result of a processing the output provided by the quantum computer 110. In various embodiments, the computing entity 10 and the controller 30 may communicate via a direct wired and/or wireless connection and/or via one or more wired and/or wireless networks 20.

The computing entity 10 may also comprise a user interface device comprising one or more user input/output interfaces (e.g., a display 1516 and/or speaker/speaker driver coupled to a processing device 1508 and a touch screen, keyboard, mouse, and/or microphone coupled to a processing device 1508). For instance, the user output interface may be configured to provide an application, browser, user interface, interface, dashboard, screen, webpage, page, and/or similar words used herein interchangeably executing on and/or accessible via the computing entity 10 to cause display or audible presentation of information/data and for interaction therewith via one or more user input interfaces. The user input interface can comprise any of a number of devices allowing the computing entity 10 to receive data, such as a keypad 1518 (hard or soft), a touch display, voice/speech or motion interfaces, scanners, readers, or other input device. In embodiments including a keypad 1518, the keypad 1518 can include (or cause display of) the conventional numeric (0-9) and related keys (#, *), and other keys used for operating the computing entity 10 and may include a full set of alphabetic keys or set of keys that may be activated to provide a full set of alphanumeric keys. In addition to providing input, the user input interface can be used, for example, to activate or deactivate certain functions, such as screen savers and/or sleep modes. Through such inputs the computing entity 10 can collect information/data, user interaction/input, and/or the like.

The computing entity 10 can also include volatile storage or memory 1522 and/or non-volatile storage or memory 1524, which can be embedded and/or may be removable. For instance, the non-volatile memory may be ROM, PROM, EPROM, EEPROM, flash memory, MMCs, SD memory cards, Memory Sticks, CBRAM, PRAM, FeRAM, RRAM, SONOS, racetrack memory, and/or the like. The volatile memory may be RAM, DRAM, SRAM, FPM DRAM, EDO DRAM, SDRAM, DDR SDRAM, DDR2 SDRAM, DDR3 SDRAM, RDRAM, RIMM, DIMM, SIMM, VRAM, cache memory, register memory, and/or the like. The volatile and non-volatile storage or memory can store databases, database instances, database management system entities, data, applications, programs, program modules, scripts, source code, object code, byte code, compiled code, interpreted code, machine code, executable instructions, and/or the like to implement the functions of the computing entity 10.

Conclusion

Many modifications and other embodiments of the invention set forth herein will come to mind to one skilled in the art to which the invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed is:

1. A confinement assembly configured for confining one or more quantum objects, the confinement assembly comprising:

a first substrate having a plurality of potential generating elements formed thereon, the plurality of potential generating elements operable for generating one or more confinement regions configured for confining the one or more quantum objects;

at least a portion of a laser formed on the first substrate, wherein the at least a portion of the laser comprises gain media and at least a portion of a resonant structure, wherein the confinement assembly at least partially defines an optical path for causing at least one optical beam to interact with the at least a portion of the laser and the at least one optical beam is one of (a) a seeding laser beam configured to control at least one property of light emitted by the laser or (b) an optical pumping beam configured to power lasing activity of the laser.

2. The confinement assembly of claim 1, wherein the optical path for providing the at least one optical beam comprises a free space optical path.

3. The confinement assembly of claim 2, wherein the free space optical path is defined at least in part by one or more free space optics elements.

4. The confinement assembly of claim 1, wherein the optical path is configured to cause the at least one optical beam to interact with the at least a portion of the laser by causing the at least one optical beam to be incident on at least one of the gain media or the resonant structure.

5. The confinement assembly of claim 1, wherein the optical path comprises a waveguide disposed in at least one of the first substrate or a second substrate secured with respect to the first substrate.

6. The confinement assembly of claim 5, wherein the waveguide is configured to cause the at least one optical beam to interact with the at least a portion of the laser by one of (i) providing the at least one optical beam to be incident on at least one of the gain media or the resonant structure via an out-of-plane coupler, (ii) providing the at least one optical beam to be incident on at least one of the gain media or the resonant structure via an edge coupling, or (iii) causing the at least one optical beam to interact with the gain media via evanescent coupling.

7. The confinement assembly of claim 5, wherein the waveguide is a slab waveguide and the slab waveguide is configured to cause the at least one optical beam to interact with the at least a portion of the laser via at least one of an out-of-plane coupler, evanescent coupling, or direct coupling.

8. The confinement assembly of claim 5, wherein the waveguide is a slab waveguide and the slab waveguide is optically coupled to the at least a portion of the laser via a metasurface coupler.

9. The confinement assembly of claim 8, wherein the slab waveguide is configured to have two or more optical beams propagating therethrough, where the two or more optical beams differ from one another in at least one of wavelength or polarization, and the metasurface coupler is configured to cause the at least a portion of the laser to interact with only one of the two or more optical beams.

10. The confinement assembly of claim 1, wherein the at least one optical beam is generated by one of (a) an external laser source external to the confinement assembly or (b) an integrated laser that is part of the confinement assembly.

11. The confinement assembly of claim 1, further comprising a second substrate secured with respect to the first substrate, wherein the second substrate at least partially defines the optical path for causing the at least one optical beam to interact with the at least a portion of the laser.

12. A confinement assembly configured for confining one or more quantum objects, the confinement assembly comprising:

a first substrate having a plurality of potential generating elements formed thereon, the plurality of potential generating elements operable for generating one or more confinement regions configured for confining the one or more quantum objects;

a second substrate that is secured with respect to the first substrate; and at least a portion of a laser formed on the second substrate, wherein the at least a portion of the laser comprises gain media and at least a portion of a resonant structure, wherein the confinement assembly at least partially defines an optical path for causing at least one optical beam to interact with the at least a portion of the laser and the at least one optical beam is one of (a) a seeding laser beam configured to control at least one property of light emitted by the laser or (b) an optical pumping beam configured to power lasing activity of the laser.

13. The confinement assembly of claim 12, wherein the optical path comprises at least one waveguide disposed in at least one of the first substrate or the second substrate.

14. The confinement assembly of claim 13, wherein the at least one waveguide is configured to cause the at least one optical beam to interact with the at least a portion of the laser by one of (a) providing the at least one optical beam to be incident on at least one of the gain media or the resonant structure via an out-of-plane coupler, (b) providing the at least one optical beam to be incident on at least one of the gain media or the resonant structure via an edge coupling, or (c) causing the at least one optical beam to interact with the gain media via evanescent coupling.

15. The confinement assembly of claim 13, wherein the at least one waveguide comprises a slab waveguide that is configured to cause the at least one optical beam to interact with the at least the portion of the laser via at least one of an out-of-plane coupler, evanescent coupling, or direct coupling.

16. The confinement assembly of claim 13, wherein the at least one waveguide comprises a slab waveguide that is coupled to the at least a portion of the laser via a metasurface coupler, the slab waveguide is configured to have two or more optical beams propagating therethrough, where the two or more optical beams differ from one another in at least one of wavelength or polarization, and the metasurface coupler is configured to cause the at least a portion of the laser to interact with only one of the two or more optical beams.

17. The confinement assembly of claim 12, wherein the at least one optical beam is generated by one of (a) an external laser source external to the confinement assembly or (b) an integrated laser that is part of the confinement assembly.

18. A confinement assembly configured for confining one or more quantum objects, the confinement assembly comprising:

a first substrate having a plurality of potential generating elements formed thereon, the plurality of potential generating elements operable for generating one or more confinement regions configured for confining the one or more quantum objects; and respective portions of a plurality of lasers formed as part of the confinement assembly, wherein at least one laser of the plurality of lasers is configured to provide a respective seed laser beam to at least one other laser of the plurality of lasers.

19. The confinement assembly of claim 18, wherein the at least one other laser of the plurality of lasers is configured to provide a respective seed laser beam to another laser of the plurality of lasers.

20. The confinement assembly of claim 18, wherein an optical path configured for providing the respective seed laser beam from the at least one laser to the at least one other laser comprises a splitter and the at least one other laser of the plurality of lasers comprises two or more lasers of the plurality of lasers.

21. The confinement assembly of claim 18, wherein the at least one laser is configured to be seeded by an external laser that is external to the confinement assembly.

* * * * *